(12) United States Patent
Finarov et al.

(10) Patent No.: US 8,652,872 B2
(45) Date of Patent: Feb. 18, 2014

(54) SOLAR CELLS AND METHOD OF MANUFACTURING THEREOF

(75) Inventors: Moshe Finarov, Rechovot (IL); Mikhael Matusovsky, Rishon-LeZion (IL); Amir Noy, Kfar Mordechai (IL)

(73) Assignee: Utilight Ltd., Yavne (IL)

( * ) Notice: Subject to any disclaimer, the term of this patent is extended or adjusted under 35 U.S.C. 154(b) by 72 days.

(21) Appl. No.: 13/123,532

(22) PCT Filed: Oct. 12, 2009

(86) PCT No.: PCT/IL2009/000976
§ 371 (c)(1),
(2), (4) Date: Apr. 11, 2011

(87) PCT Pub. No.: WO2010/041262
PCT Pub. Date: Apr. 15, 2010

(65) Prior Publication Data
US 2011/0197965 A1  Aug. 18, 2011

(30) Foreign Application Priority Data

Oct. 12, 2008 (IL) .......................... 194665
May 7, 2009 (IL) .......................... 198629
Jun. 18, 2009 (WO) .................. PCT/IL2009/000608

(51) Int. Cl.
*H01L 21/00* (2006.01)
(52) U.S. Cl.
USPC ............... 438/98; 257/E21.585; 136/256
(58) Field of Classification Search
USPC .............. 257/E21.585, E31.124; 438/98, 57; 136/256
See application file for complete search history.

(56) References Cited

U.S. PATENT DOCUMENTS

| | | | |
|---|---|---|---|
| 4,265,545 A | 5/1981 | Slaker |
| 4,355,196 A | 10/1982 | Chai |
| 4,469,430 A | 9/1984 | Terashima |
| 4,701,592 A | 10/1987 | Cheung |
| 4,970,196 A | 11/1990 | Kim et al. |
| 5,021,808 A | 6/1991 | Kohyama |
| 5,156,938 A | 10/1992 | Foley et al. |
| 5,421,909 A | 6/1995 | Ishikawa et al. |
| 5,654,975 A | 8/1997 | Green et al. |

(Continued)

FOREIGN PATENT DOCUMENTS

| EP | 0776051 | 5/1997 |
|---|---|---|
| EP | 1968121 | 9/2008 |

(Continued)

OTHER PUBLICATIONS

Verlinden et al., Super Self-Aligned Technology for Backside Contact Solar Cells: A Rout to Low Cost and High Efficiency, 1990, IEEE, Photovoltaic specialists conference record of the twenty first IEEE, 257-262.*

(Continued)

*Primary Examiner* — Shaun Campbell

(57) ABSTRACT

A photovoltaic cell, the cell comprising:
  a silicon substrate of bulk silicon material having front and rear surfaces;
  an emitter layer on the rear surface of said substrate;
  elongate channels through the emitter layer;
  elongate contacts to the bulk of the silicon substrate within at least some of the elongate channels, wherein the contacts are narrower than the channels; and
gaps in the emitter between at least some of the elongate contacts and the emitter layer on the sides of the contacts.

38 Claims, 12 Drawing Sheets

(56) References Cited

U.S. PATENT DOCUMENTS

| | | | |
|---|---|---|---|
| 6,060,127 | A | 5/2000 | Tatah et al. |
| 6,177,151 | B1 | 1/2001 | Chrisey et al. |
| 6,180,912 | B1 | 1/2001 | Tatah |
| 6,331,177 | B1 | 12/2001 | Munnerlyn et al. |
| 6,610,455 | B1 | 8/2003 | Burberry et al. |
| 6,649,861 | B2 | 11/2003 | Duignan |
| 6,766,764 | B1 | 7/2004 | Chrisey et al. |
| 6,805,918 | B2 | 10/2004 | Auyeung et al. |
| 6,815,015 | B2 | 11/2004 | Young et al. |
| 7,001,467 | B2 | 2/2006 | Piqué et al. |
| 7,014,885 | B1 | 3/2006 | Piqué et al. |
| 7,046,266 | B1 | 5/2006 | Retschke et al. |
| 7,217,334 | B2 | 5/2007 | Toyoda |
| 7,335,555 | B2 | 2/2008 | Gee et al. |
| 7,339,110 | B1 * | 3/2008 | Mulligan et al. ............... 136/256 |
| 2004/0056009 | A1 | 3/2004 | Gross et al. |
| 2005/0054121 | A1 | 3/2005 | Handy et al. |
| 2005/0178431 | A1 | 8/2005 | Yang et al. |
| 2007/0169806 | A1 | 7/2007 | Fork et al. |
| 2007/0178232 | A1 | 8/2007 | Kodas et al. |
| 2008/0072953 | A1 * | 3/2008 | Stephens et al. ............... 136/249 |
| 2008/0113292 | A1 | 5/2008 | Matsuo |
| 2008/0139075 | A1 | 6/2008 | Birrell et al. |
| 2008/0202577 | A1 * | 8/2008 | Hieslmair ...................... 136/244 |
| 2008/0276986 | A1 * | 11/2008 | Aberle et al. ................. 136/256 |
| 2009/0074987 | A1 | 3/2009 | Auyeung et al. |
| 2009/0260685 | A1 * | 10/2009 | Lee et al. ....................... 136/256 |

FOREIGN PATENT DOCUMENTS

| | | | |
|---|---|---|---|
| FR | 2400261 | | 3/1979 |
| JP | 11-340162 | | 12/1999 |
| WO | WO 2006/029250 | | 3/2006 |
| WO | WO 2006/096904 | | 9/2006 |
| WO | WO 2007/059577 | A1 * | 5/2007 ............ H01L 21/283 |
| WO | WO 2008/115814 | | 9/2008 |
| WO | WO 2009/153792 | | 12/2009 |
| WO | WO 2010/041262 | | 4/2010 |

OTHER PUBLICATIONS

Office Action Dated Dec. 14, 2011 From the Israel Patent Office Re. Application No. 192291 and Its Translation Into English.
Office Action Dated Jan. 24, 2012 From the Israel Patent Office Re. Application No. 194665 and Its Translation Into English.
Glunz et al. "Laser-Fired Contact Silicon Solar Cells on P- and N-Substrates", 19th European Photovoltaic Solar Eneregy Conference, Paris, France, Jun. 7-11, 2004.
Schneiderloechner et al. "Scanning ND: YAG Laser System for Industrially Applicable Processing in Silicon Cell Manufacturing",Proceedings of 3rd World Conference on Photovoltaic Energy Conversion, 2: 1364-1367, 2003.
Office Action Dated Mar. 11, 2012 From the Israel Patent Office Re. Application No. 198629 and Its Translation Into English.
Communication Pursuant to Article 94(3) EPC Dated Mar. 21, 2012 From the European Patent Office Re. Application No. 09766327.2.
Communication Relating to the Results of the Partial International Search Dated Jan. 20, 2011 From the International Searching Authority Re. Application No. PCT/IL2009/000976.
International Preliminary Report on Patentability Dated Aug. 3, 2010 From the International Preliminary Examining Authority Re.: Application No. PCT/IL2009/000608.
International Search Report and the Written Opinion Dated Mar. 7, 2011 From the International Searching Authority Re.: Application No. PCT/IL2009/000976.
International Search Report and the Written Opinion Dated Dec. 27, 2009 From the International Searching Authority Re.: Application No. PCT/IL2009/000608.
Response Dated Mar. 24, 2010 to International Search Report and the Written Opinion of Dec. 27, 2009 From the International Searching Authority Re.: Application No. PCT/IL2009/000608.

Agostinelli et al. "Local Contact Structures for Industrial PERC-Type Solar Cells", 20th EU-PVSC, 4 P., 2005.
Agostinelli et al. "Silicon Solar Cells on Ultra-Thin Substrates for Large Scale Production", 21st EU PVSEC, Dresden, 2006.
Archer et al. "Clean Electricity From Photovoltaics", Series on Photoconversion of Solar Energy, vol. 1, 2001. Abstract.
Cesar et al. "Benchmark of Open Rear Side Solar Cell With Improved AL-BSF Process at ECN", 23rd European Photovoltaic Solar Energy Conference, Valencia, Spain, Sep. 1-5, 2008.
Choulat "High Efficiency Industrial Type PERC Solar Cell on Very Thin EFG Substrates", retrieved from the Internet.
Choulat et al. "Above 17% Industrial Type PERC Solar Cell on Thin Multi-Crystalline Silicon Substrate", 22nd European Photovoltaic Solar Energy Conference and Exhibition, Milano, Italy, Sep. 3-7, 2007.
Grohe et al. "Laser Technology for Contacting High-Efficiency Silicon Solar Cells the Laser-Fired Contacts Approach", 20th EU-PVSEC, 2 P., 2005.
Hofmann et al. "PECVD-ONO: A New Deposited Firing Stable Rear Surface Passivation Layer System for Crystalline Silicon Solar Cells", Advances in OptoElectronics, 2008: 10 P., 2008.
Narayanan "Fifty Years of Crystalline Silicon Solar Cells", Electro International, XP010305288, p. 678-683, Apr. 16-18, 1991. Fig.1.
Photovoltaic Insider's Report "Late News Developments", Photovoltaic Insider's Report, Dallas , TX, USA XP000189851, 10(8), Aug. 2, 1991.
Romijn et al. "Aspire: A New Industrial MWT Cell Technology Enabling High Efficiencies on Thin and Large MC-SI Wafers", Proceedings of the 22nd EU-PVSEC, 7 P., 2007.
Schneiderlöchner et al. "Scanning ND:YAG Laser System for Industrially Applicable Processing in Silicon Cell Manufacturing",Proceedings of 3rd World Conference on Photovoltaic Energy Conversion, 2: 1364-1367, 2003.
Verlinden et al. "Super Self-Aligned Technology for Backside Contact Solar Cells. A Route to Low Cost and High Efficiency", Conference Record of the 21st IEEE Photovoltaic Specialists Conference, Kissimee, FL, USA, May 21-25, 1990, XP010003187, p. 257-262, May 21, 1990. Fig.1.
International Preliminary Report on Patentability Dated Apr. 21, 2011 From the International Bureau of WIPO Re. Application No. PCT/IL2009/000976.
Search Report Dated Aug. 17, 2012 From the State Intellectual Property Office of the People's Republic of China Re. Application No. 200980133660.4.
Translation of Office Action Dated Aug. 17, 2012 From the State Intellectual Property Office of the People's Republic of China Re. Application No. 200980133660.4.
Restriction Official Action Dated Nov. 13, 2012 From the US Patent and Trademark Office Re. U.S. Appl. No. 12/999,313.
Official Action Dated Mar. 12, 2013 From the US Patent and Trademark Office Re. U.S. Appl. No. 12/999,313.
Pique et al. "Applications of Laser Direct-Write for Embedding Microelectronics", Proceedings of the SPIE, 6606: 66060R-1-66060R-9, 2007.
Office Action Dated May 20, 2013 From the Israel Patent Office Re. Application No. 198629 and Its Translation Into English.
Office Action Dated Jul. 15, 2013 From the Israel Patent Office Re. Application No. 192291 and Its Translation Into English.
Official Action Dated Aug. 7, 2013 From the US Patent and Trademark Office Re. U.S. Appl. No. 12/999,313.
Translation of Office Action Dated Apr. 28, 2013 From the State Intellectual Property Office of the People's Republic of China Re. Application No. 200980133660.4.
Office Action Dated Apr. 29, 2013 From the Israel Patent Office Re. Application No. 212260 and Its Translation Into English.
Translation of Office Action Dated Mar. 13, 2013 From the State Intellectual Property Office Re. Application No. 200980151314.9.
Translation of Search Report Dated Mar. 13, 2013 From the State Intellectual Property Office Re. Application No. 200980151314.9.
Applicant-Initiated Interview Summary Dated Dec. 11, 2013 From the US Patent and Trademark Office Re. U.S. Appl. No. 12/999,313.
Office Action Dated Dec. 9, 2013 From the Israel Patent Office Re. Application No. 210104 and Its Translation Into English.

\* cited by examiner

FIG. 2-I

SOLAR CELLS AND METHOD OF MANUFACTURING THEREOF

RELATED APPLICATIONS

This application is a National Phase of PCT Patent Application No. PCT/IL2009/000976 having International filing date of Oct. 12, 2009, which claims the benefit of priority of Israel Patent Application No. 198629 filed on May 7, 2009, Israel Patent Application No. 194665 filed on Oct. 12, 2008 and is also a continuation in part of PCT Patent Application No. PCT/IL2009/000608 filed Jun. 18, 2009. The contents of the above applications are all incorporated herein by reference.

FIELD AND BACKGROUND OF THE INVENTION

The present invention, in some embodiments thereof, relates to photovoltaic solar cells and to methods of manufacturing such cells. More particularly, but not exclusively, it is directed to methods of manufacturing metal contacts at the front and back surfaces of solar cells.

Photovoltaic cells are cells that absorb light photons (such as from sunlight) and convert the light photons into electricity. The cells generally comprise silicon substrates and the absorbed photons are converted into electron-hole pairs. The substrates generally include contacts to n-type silicon for collection of the electrons and contacts to p-type silicon for collection of the holes. The silicon substrates may typically be of a p or n-type. For purpose of explanation of the present invention, reference will be made to a p-type silicon substrate, with an n-type layer to form a p-n junction. However, it is noted that the same explanations, with the necessary changes, generally apply to an n-type substrate with a p-type layer.

In the art, there are several layouts of photovoltaic cells. One widely used layout for a p-type substrate has the p-n junction at the front surface of the substrate. It has contacts to the n-layer of the p-n junction at the front surface of the substrate and contacts to the bulk of the p-type substrate at the rear surface of the substrate.

An n-type doped layer is first produced on the front surface of the p-type substrate. The front side of the substrate is usually covered with a passivation layer. In order to provide a contact to the n-type layer at the front side, an opening in the passivation layer is formed into which metal is deposited (as for example by screen printing) such that the metal contacts the n-type layer. The contacts to the n-type layer form a grid or fingers on the front surface of the substrate. Alternatively, a paste of metal and glass frit is laid on the passivation layer. When the substrate is heated, the metal penetrates through the passivation layer and contacts the n-layer.

The rear surface of the substrate generally includes contacts to the bulk of the substrate and is also used for back reflecting the photons that were not converted into electrons-hole pairs during their propagation to the rear surface. In addition, adding a passivation layer to the rear surface increases the effectiveness of the cell.

In the prior art, the contacts to the p-type silicon at the rear surface of the substrate are formed either as a grid or as a metal layer coating the entire rear surface. Forming a grid on the rear surface, as opposed to full metal coating, could reduce the back reflection.

The prior art methods that form a full metal coating on the entire rear side, typically do not form a passivation layer on the rear side. One of the reasons for not providing passivation is the combination of the fact that the full aluminum coating provides moderate passivation and addition of passivation layer has manufacturing limitations.

The prior art described some methods for producing contacts at the rear surface including a passivation layer. GLUNZ, S. W. et al. "Laser-Fired Contact Silicon Solar Cells on p- and n-Substrates", 19$^{th}$ European Photovoltaic Solar Energy Conference, June 2004, France describes forming a full Al coating on top of a passivation layer and then laser firing the full Al coatings at specific points thereof through the passivation layer. Firing causes the fired points to alloy with the passivation layer and contact the bulk of the substrate. The reflectivity in this method is achieved by the full metal coating at the rear surface.

Another method known in the art is creating openings in the passivation layer and depositing metal therein, usually by screen printing. Some of the prior art designs produce a p+ type layer in the opening to which the contact will connect. In general, the p+ layer is achieved by boron diffusion which creates a p+ type layer at an entire surface of the opening. A known design of such a cell is named PERF cells, as described in GREEN, M. "Crystalline Silicon solar Cells", Clean Electricity From Photovoltaics, 2001, Chapter 4. The PERF Cells are produced by photolithography which requires an accurate registration between the openings in the passivation layer and doped layer and the metal deposited therein. The PERF cells provide an n+ layer on the rear side which improves its passivation properties.

The rear side passivation is generally produced before forming the metal grid. The prior art uses this order of actions since the production of the metal grid cause residues on the substrate at the area of connection which have to be cleaned before producing a passivation layer. As this is known to be a complex procedure, the passivation layer is generally produced before the contacts.

Some of the passivation layers used in the art do not form good passivation when applied on a p-type substrate and therefore the prior art uses expensive passivation materials which are produced with a generally complex procedure. Some of the prior art methods add a generally floating n-type doped layer at the rear surface between the bulk of the substrate and the passivation layers. Other methods use a passivation layer that creates an induced emitter at the rear surface. However, having a doped layer or induced emitter at the rear surface could cause shunting between the contacts and the doped layer or induced emitter. Therefore the contacts to the bulk of the substrate should preferably not contact the doped layer at the rear side. In avoiding this problem these designs are considered more complicated to produce and therefore also more expensive.

Another layout of photovoltaic substrates provides both contacts to n-type and p-type silicon areas produced at the rear surface of the substrate. In this layout there is a p-n junction formed at the rear surface and no connection and generally no p-n junction is formed on the front surface.

U.S. Pat. No. 7,339,110, for example, describes a manufacturing method of n-type substrates with both contacts to p- and n-type silicon at the rear side of the substrate. The method includes about twenty steps, three of which are patterning steps requiring accurate alignment. The complex manufacturing process substantially increases the cost of manufacturing such cells.

As yet unpublished PCT Application no. PCT/IL2009/000608 filed on Jun. 18, 2009 teaches a method of producing contacts at the front and/or rear sides of the substrate where the openings in the passivation layer and the deposition of metal are performed by a same laser or two different lasers with the same optical set-up. The use of the same laser or set-up enables automatic and substantially exact alignment of the openings and the deposited metal such that a relative thick layer of metal can be deposited with one laser operation. The methods of producing contacts disclosed in this application are applicable to some embodiments of the present invention and are included herein by reference to the extent of their applicability.

Additional background art includes HOFFMAN M. et al., "PECVD-ONO: A New Deposited Firing Stable Rear Surface Passivation Layer System for Crystalline Silicon Solar Cells", Hindawi Publishing Corporation, Advances in Opto-Electronics, Vol. 2008, Article ID 485467; GROHE, A., "Laser Technology for Contacting High-Efficiency Silicon Solar Cells, The Laser Fired Contacts Approach"; Agostinelli, G. et al. "Local Contact Structures for Industrial PERC-Type Solar Cells"; CHOULAT, P. et al, "High efficiency industrial type PERC Solar Cell on very thin EFG Substrates"; Agostinelli G. et al. "Silicon Solar Cells on Ultra-Thin Substrates for Large Scale Production", Presented at the 21st EU PVSEC, Dresden, 2006, Choulat P. et al. "Above 17% industrial type PERC Solar Cell on thin Multi-Crystalline Silicon Substrate", 22nd European Photovoltaic Solar Energy Conference and Exhibition, 3-7 Sep. 2007 Milano, Italy; ROMIJN, I. et al., "Aspire: A New Industrial MWT Cell Technology Enabling High Efficiencies on Thin and Large MC-Si Wafers" and CESAR, I. et al. "Benchmark of Open Rear Side Solar Cell with Improved Al-BSF Process at ECN", Presented at the 23rd European Photovoltaic Solar Energy Conference, Valencia, Spain, 1-5 Sep. 2008.

SUMMARY OF THE INVENTION

An aspect of some embodiments of the present invention are directed towards methods of producing electrical contacts to solar cells.

An aspect of some embodiments of the invention refers to producing a contact to the bulk of a substrate through a doped layer or emitter at the rear surface of a photovoltaic cell. As referred herein, the term "doped layer" or "emitter" refer to a layer with opposite polarity to the bulk substrate, to a floating emitter or to an induced emitter created by a passivation layer. In some embodiments, the doped layer is coated with a passivation layer. According to some aspects of the invention, the contacts to the bulk are made via opening in the emitter layer and/or passivation layer and gaps are provided between the contacts to the bulk of the substrate and the emitter layer.

The produced contacts are preferably formed as fingers (or a grid). A preferred embodiment of the invention includes providing an opening, for example a strip or channel, in the passivation layer and depositing metal in the opening, the width of the metal being narrower than that of the opening such that gaps are left between the sidewalls of the opening and the deposited metal. The opening and deposition are preferably performed by laser induced transfer, optionally by the same laser or laser set-up. The deposited contacts are optionally fired in order to provide mechanical stability and electrical connection to the bulk of the substrate. The method further optionally includes etching the doped layer and silicon at the gaps and/or providing passivation in the gaps (which does not induce an emitter layer).

An aspect of some embodiments of the invention refers to producing a contact to the bulk of the substrate of a bare photovoltaic cell which is not coated with a passivation layer. A grid of conducting material, forming contacts, is deposited on a bare substrate and optionally heated or fired for mechanically and electrically connecting the contacts to the bulk. In some embodiments, the substrate is cleaned or etched after deposition and/or firing of the contacts, preferably by use of a material to which the contacts are resistant. In some embodiments, the substrate is coated with a doped layer and etching of the substrate removes the exposed doped layer. In some embodiments, the substrate is then coated with a passivation layer.

An aspect of some embodiments of the invention refers to various layouts of photovoltaic cells. In some embodiments, the rear surface includes contacts to the bulk substrate and contacts to a doped layer. In some embodiments of the invention, the front surface includes contacts to a doped layer and the rear surface includes contacts to the bulk substrate. According to some embodiments, the rear surface includes gaps between a doped layer or induced emitter and the contacts. According to some aspects, the contacts are finger shaped and are optionally laid down as a contiguous piece of material. In preferred embodiments, the methods of the invention and/or those taught in as yet unpublished PCT Application no. PCT/IL2009/000608 (the disclosure of which is incorporated by reference) for forming contacts are used for at least some of the contacts.

Preferably, in all the embodiments of the methods and layouts the deposited contacts are thick enough (i.e., has a low enough resistance) so that no additional metal is required to be layered on it.

An aspect of some embodiments of the present invention is providing a reflector on the rear side of the substrate after producing contacts thereon. In some embodiments, the reflector is a thin film of reflecting material.

According to an aspect of some embodiments of the present invention there is provided a photovoltaic cell, the cell comprising:

a silicon substrate of bulk silicon material having front and rear surfaces;

an emitter layer on the rear surface of said substrate;

elongate channels through the emitter layer;

elongate contacts to the bulk of the silicon substrate within at least some of the elongate channels, wherein the contacts are narrower than the channels; and gaps in the emitter between at least some of the elongate contacts and the emitter layer on the sides of the contacts.

According to some embodiments, the emitter layer comprises a doped layer with opposite polarity to the silicon substrate. According to some embodiments, the emitter comprises an induced emitter created by a passivation layer provided on the rear surface of the substrate.

According to some embodiments, the cell further comprises a passivation layer produced on the emitter layer at the rear surface of the substrate.

According to some embodiments, the elongate contacts have a width of between 10 µm-100 µm. According to some embodiments, the elongate contacts have a thickness of between 10 µm-100 µm. According to some embodiments, the ratio of the height to width of the elongate contacts is between about 0.3 and 3.

According to some embodiments, the contacts are formed of a conducting material that is substantially homogeneous over its thickness.

According to some embodiments, a heavily doped layer is created between the contacts to the bulk material and the substrate. According to some embodiments, the gaps separate between the heavily doped layer and the emitter layer.

According to some embodiments, the cell further comprises additional elongate channels through the passivation layer on the rear surface of the substrate and additional elongate contacts to said emitter layer within said channels through the passivation layer. According to some embodiments, the cell further comprises an emitter layer at the front surface of the substrate and a passivation layer on the emitter layer at the front surface of the substrate, and the cell further includes contacts to the emitter layer at the front surface of the substrate.

According to some embodiments, the elongate contacts to the emitter layer have a width of between 10 µm-100 µm. According to some embodiments, the elongate contacts to the emitter layer have a thickness of between 10 µm-100 µm. According to some embodiments, the ratio of the height to width of the elongate contacts to the emitter layer is between about 0.1 and 1.

According to some embodiments, said cell includes an additional passivation layer at its rear surface. According to some embodiments, said additional passivation layer is present only in said gaps.

According to some embodiments, the cell further comprises a reflective layer at the rear surface of the cell. According to some embodiments, the reflective layer is a thin metal layer. According to some embodiments, the reflective layer is a dielectric layer.

According to some embodiments of the invention, there is provided a method of producing a contact to a silicon substrate through an emitter, the method comprising:

creating an opening in the emitter layer at a surface of said substrate; and depositing conducting material in said opening, the conducting material being smaller in size than the opening such that gaps are left between the conducting material and the sidewalls of the opening.

According to some embodiments, producing a contact to a silicon substrate through an emitter layer comprises producing a contact to a silicon substrate having a passivation layer over the emitter layer and wherein creating an opening comprises creating an opening through the passivation layer and through at least part of the emitter layer.

According to some embodiments, the method further comprises:

heavily doping the point of connection of the deposited conducting material with the substrate.

According to some embodiments, the method further comprises:

creating an additional opening in the passivation layer at said surface; and depositing conducting material in the opening thereby creating a contact to the emitter layer.

According to some embodiments, the method further comprises:

producing a first busbar for connecting between the contacts to the bulk of the substrate; and producing a second busbar for connecting between the contacts to the emitter layer.

According to some embodiments, producing a first and second busbar comprises producing a first and second busbar such that there is no connection between the first and second busbars.

According to some embodiments, the method further comprises:

etching the gaps in the opening; and passivating at least the etched gaps.

According to some aspects of the invention, there is provided a method of producing a contact to a silicon substrate through an emitter layer, the method comprising:

creating an opening in at least part of the emitter layer at a surface of said substrate;

depositing conducting material in said opening;

heavily doping the point of connection of the conducting material to the substrate; and etching gaps between the emitter layer and the heavily doped layer.

According to some embodiments, creating an opening in at least part of the emitter layer comprises creating an opening in a passivation layer and at least part of an emitter layer.

According to some embodiments, etching gaps comprises etching with TMAH. According to some embodiments, etching gaps comprises etching with KOH. According to some embodiments, the method further comprises passivating the etched gaps. According to some embodiments, passivating the etched gaps comprises passivating an entire surface of the substrate. According to some embodiments, passivating the etched gaps comprises passivating substantially only the silicon in the etched gaps.

According to some embodiments, the method further comprises:

creating an opening in a passivation layer at an opposite surface to said surface; and depositing conducting material in the opening at the opposite surface, thereby creating a contact to an emitter layer at said opposite surface.

According to some embodiments, depositing conducting material in the opening thereby creating a contact to the emitter layer comprises depositing conducting material having a width of between 10 µm-100 µm.

According to some embodiments, depositing conducting material in the opening thereby creating a contact to the emitter layer comprises depositing conducting material having a thickness of between 10 µm-100 µm.

According to some embodiments, depositing conducting material in the opening thereby creating a contact to the emitter layer comprises depositing conducting material having a ratio of the height to width between about 0.1 and 1.

According to some aspects of the invention, there is provided a method of producing a contact to a bare surface of a silicon substrate, the method comprising:

depositing conducting material directly on the bare surface of the substrate;

etching the bare surface; and passivating the bare surface after deposition of the conducting material.

According to some embodiments, etching the bare surface comprises etching only the silicon on said surface. According to some embodiments, said bare surface includes an emitter layer and wherein etching the bare surface comprises etching the exposed emitter layer on said bare surface.

According to some embodiments, etching the bare surface comprises etching by KOH. According to some embodiments, etching the bare surface comprises etching by TMAH.

According to some embodiments, passivating the bare substrate comprises passivation the exposed silicon on said surface. According to some embodiments, passivating the bare substrate comprises passivation the entire surface, including the exposed silicon and deposited conducting material on said surface.

According to some embodiments, the method further comprises:

firing the conducting material after deposition.

According to some embodiments, depositing conducting material comprises depositing material having a width of between 10 µm-100 µm. According to some embodiments, depositing conducting material comprises depositing material having a thickness of between 10 µm-100 µm. According to some embodiments, depositing conducting material comprises depositing material having a ratio of the height to width between about 0.1 and 1.

According to some embodiments, the method further comprises:

coating the rear side of the substrate with a reflective layer.

According to some aspects of the invention, there is provided a photovoltaic cell, the cell comprising:

a silicon substrate of bulk silicon material having front and rear surfaces;

at least two elongate contacts to the bulk of the silicon substrate at the rear surface of the substrate, wherein gaps separate between the contacts; and a reflective layer coating the entire rear surface, including the contacts.

According to some embodiments, the reflective layer is a thin metal layer. According to some embodiments, the reflective layer is a dielectric layer.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

BRIEF DESCRIPTION OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings:

FIGS. 2A-2K are schematic illustrations of acts of the methods of FIGS. 1A-1B;

DESCRIPTION OF EMBODIMENTS OF THE INVENTION

Figure 1A:
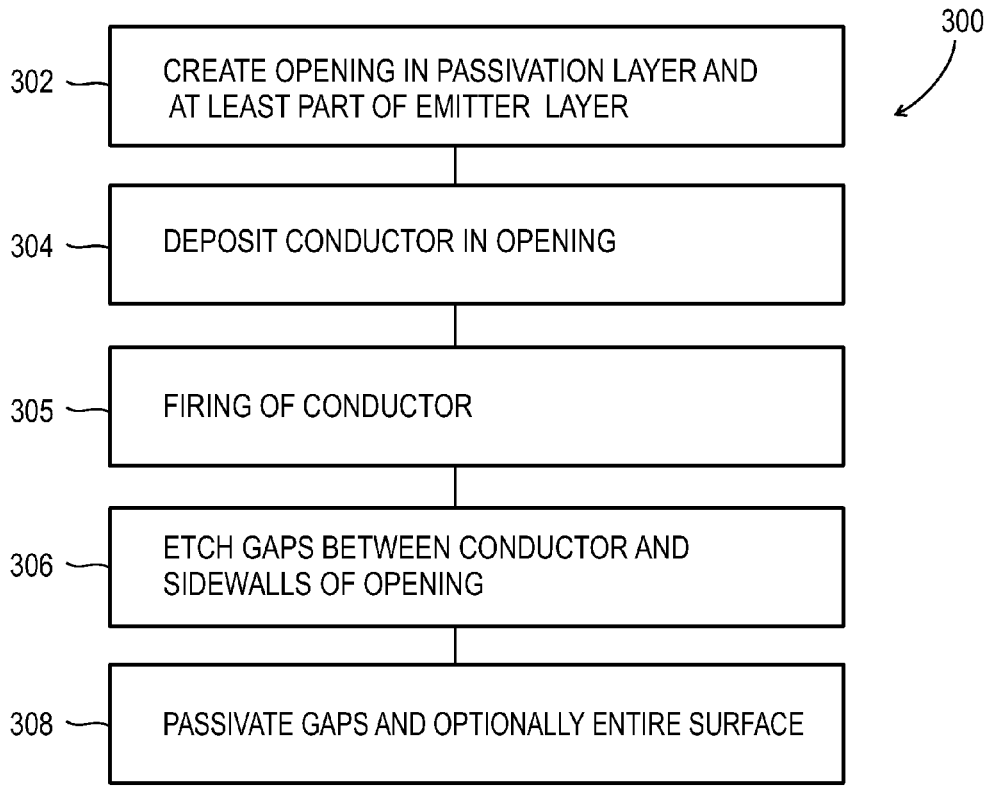
FIGS. 1A and 1B are flowcharts of methods of manufacturing a contact to the bulk of a silicon substrate in accordance with some exemplary embodiments of the invention.

An aspect of some embodiments of the invention, as described below, provides methods of manufacturing and layouts of photovoltaic cells having a rear side on which a passivation layer is produced. The rear side of the cell further preferably includes a doped layer or induced emitter which provides for simpler passivation methods. There is further provided in some embodiments of the invention a grid of contacts to the bulk of the substrate at the rear side of the cell. The prior art has encountered two major problems with such methods and layouts:

1. Creating a contact to the bulk of the substrate on the rear side might cause shunting with the emitter or doped layer; and 2. Providing a grid of contacts on the rear side might reduce the reflectivity of the rear side and photons which were not converted into electrons-hole pairs during their propagation to the rear side might be lost.

As described below, some embodiments of the invention provide solutions to one or more of these prior art problems. Some embodiments avoid shunting between the contacts to the bulk of the substrate and the emitter by producing gaps between the contacts to the bulk and the emitter. Some embodiments provide a reflective layer at the entire rear surface of the substrate. Some embodiments solve both problems.

An aspect of some embodiments of the invention involves producing a connection to a bulk of a substrate at the rear surface of a substrate, the substrate having a doped layer or emitter and optionally also a passivation layer at the rear surface. Although reference is made to a doped layer or emitter, the doped layer may not be produced on the substrate but induced by the passivation layer.

In accordance with some embodiments of the invention, an opening, for example an elongate channel, is created in the passivation and/or emitter layer at the rear surface of the substrate. The opening may be made according to any method known in the art. In some exemplary embodiments, the opening is created by use of a laser as described in PCT/IL2009/000608. Alternatively, the opening may be created by chemical etching. Optionally, the depth of the opening is such that some or all of the emitter layer is left in said opening. The emitter layer and optionally some of the bulk of the substrate may be damaged by the laser ablation.

Conducting material, such as metal, is then deposited in the opening, optionally by detaching the metal from a source substrate utilizing energy from the same laser (or different lasers but with same optical setup) with which the opening was created. The conductor deposited in the opening is preferably narrower than the opening itself, such that the conductor does not contact the sidewalls of the opening and does not contact the emitter layer at the sides of the opening. Thus, gaps are left in the opening between the conductor and the sidewalls of the opening.

In some embodiments, the conductor is then fired or alloyed to improve connection of the conductor to the silicon. For example, firing the conductor will cause alloying between the conductor and the silicon underneath, which will remove the damaged silicon layer and/or the emitter doped layer underneath the conductor. Firing of the conductor results in mechanical stability and electrical connection between the conductor and the bulk of the substrate.

The gaps are then optionally etched to remove the laser damaged surface of the substrate in the portion of the opening not covered by the metal. Etching of the gaps removes the emitter layer from the gaps so that no shunting occurs between the contacts and the emitter layer. Preferably, the etching is performed by an etching material to which both the passivation layer and the contacts are resistant. For example, when the contacts are Al based, TMAH may be used for etching. When the contacts are Ag based, KOH may be used for etching. Alternatively, the contacts are relatively thick (more than 100 μm) such that the etching material may etch some of the metal contacts without substantially damaging their effectiveness. Optionally, PECVD may be used for etching the gaps.

In some embodiments, busbars for connection between the contacts are created. Optionally, the busbars are produced simultaneously with the contacts, for example as described in PCT/IL2009/000608 and as described below.

The etched openings are then passivated in accordance with some embodiments of the invention. Optionally, only the gaps in the openings are passivated, as for example by oxidizing the exposed silicon. Alternatively, a passivation layer, such as CVD, is laid on the entire rear surface of the substrate, including the gaps, the metal contacts and optionally the busbars. Optionally, when the busbars are passivated, the passivation layer on all or part of the busbars is removed by laser ablation, chemical etching or mechanic removal so that connections can be provided to the busbars. Alternatively, the passivation layer on the busbars is removed by the act of soldering to (the busbars of) the photovoltaic cell.

An aspect of some embodiments of the invention involves producing a contact to a bare surface of a substrate, where the bare surface does not include a passivation layer. In accordance with these embodiments, metal contacts are deposited on the bare substrate, and are optionally fired to make mechanical and electrical connection to the silicon. Deposition and/or firing of the metal contacts generally causes residues on the substrate. The inventors have found that these residues can be cleaned by etching (or cleaning) the substrate with an etch material to which the metal contacts are resistant. An example of such a material is TMAH to which Al based contacts (generally used for p-type substrates) and silver based contacts (generally used for n-type substrates) are resistant. Another exemplary material for silver based contacts is KOH.

In some embodiments, the bare surface of the substrate is produced with an emitter layer. In these embodiments, the contacts are produced on the emitter layer and connect to the bulk by firing thereof which will cause the contacts to alloy with the emitter layer and optionally some of the bulk of the silicon. Etching the substrate preferably removes the entire exposed emitter layer. Having an emitter layer in these embodiments may be advantageous since the emitter layer may cause a gettering effect (diffusion of impurities or residues into emitter layer). Removing the emitter layer thus removes most of the residues and results in improvement of the photovoltaic cell life time and therefore the effectiveness of the cell.

The surface of the substrate with the metal contacts is then generally passivated. Optionally, the entire surface, including the contacts, is passivated. Alternatively, only the silicon surface is passivated, for example by oxidizing the exposed silicon.

An aspect of some embodiments of the invention refers to producing contacts to an emitter at the front or rear surface of the substrate, the surface including an emitter and a passivation layer. In accordance with some embodiments of the invention, an opening is created in the passivation layer, preferably without damaging the emitter in the opening. In some exemplary embodiments, the opening is created by using a laser as described in PCT/IL2009/000608. Conducting material, such as metal, is then deposited in the opening, optionally by detaching the conducting material from a source substrate, preferably by utilizing energy from the same laser (or laser set-up) with which the opening is created.

The deposited conducting material connects to the emitter in the opening and is preferably wider than the opening such that the metal overlays the passivation layer at the sides of the opening. It is noted that even though that some of the emitter in the opening may be damaged by the laser, most of the emitter will remain undamaged and the laser damage will typically not harm the connection. The conducting material is preferably fired to provide mechanical and electrical connection to the emitter.

The production of contacts to the bulk of the substrate and to a doped layer (emitter) is detailed in yet unpublished: Israeli application no. 194665 filed on Oct. 12, 2008, Israeli application no. 198629 filed on May 7, 2009 and PCT Application no. PCT/IL2009/000608 filed on Jun. 18, 2009. The contents of all of the above documents are incorporated by reference as if fully set forth herein. It is noted that the contacts may be made according to any other method known in the other, such as for example screen printing.

An aspect of some embodiments of the invention is related to various layouts of photovoltaic cells optionally using the methods of contacting the silicon forming the sides of the p-n-junction described above. In some embodiments, the photovoltaic cells are coated with a passivation layer before production of the contacts thereon.

In some embodiments the rear surface includes an emitter layer (or an induced emitter created by the passivation layer), between the bulk substrate and the passivation layer, thereby providing a p-n junction at the rear surface of the substrate. In some embodiments, the rear surface includes contacts to both the bulk substrate and to the emitter.

In some embodiments of the invention, a reflector is produced on the rear surface of the substrate, preferably after production of the contacts thereto. The reflector is optionally a highly reflecting film which reflects the photons that were not converted while traveling through the cell.

In some embodiments of the invention, the substrate has a p-n junction formed by a bulk substrate and an emitter layer at the front surface and includes contacts to the emitter at the front surface and contacts to the bulk substrate at the rear surface.

In some embodiments of the invention, gaps are created between the contacts to the bulk of the substrate and the emitter layer at the rear surface of the substrate. Optionally, an additional passivation layer is provided on the gaps.

In some embodiments of the invention, the contacts (for example those at the back surface) are made of a metal including a material that heavily dopes the substrate (or emitter) at the point of connection thereto. For example, when for connecting to p-type silicon, Aluminum (Al) is the main material which forms the contacts. The Al forms a p+ layer on the substrate when heated to about 800° C. or more. For connecting to n-type silicon, silver (Ag) mixed with Antimony may be used as conducting material. The composition of Ag and Antimony forms an n+ layer on the substrate when heated to about 900° C. or more.

In these embodiments, the heavily doped layer is created only at the connection point of the metal with the silicon. Thus, when the contacts are to the bulk of a substrate at a surface including an emitter layer as described above, etching the emitter and silicon at the gaps, also creates gaps between the heavily doped layer and the emitter layer.

In accordance with some embodiments of the invention, the contacts to the bulk of the substrate and/or to the emitter layer have a width of less than 500 μm. The contacts at the front surface of the substrate are also preferably narrow since it is advantageous to have a relatively large area open to the sun.

In some embodiments of the invention, the contacts to the bulk of the substrate and/or to the emitter are finger shaped and a parallel array of such fingers is provided. Optionally, each finger of coated material has a height (thickness) larger then its width. In some embodiments, the aspect ratio (height/width) of the coated fingers is approximately between 0.3 to 3. Optionally, the height of a coated finger is between 10 µm-300 µm, for example between 10 µm-150 µm. Optionally, the height of a coated finger is between 10 µm-150 µm or between 10 µm-100 µm.

Optionally, each finger has a length of about 154 mm. alternatively; each finger has a length of about 156 mm. the length of the fingers can vary with different designs and for different sizes and shapes of a substrate. Each finger is optionally laid down as a contiguous piece of material. Optionally, the deposited material is substantially homogenous over its thickness.

Before explaining at least one embodiment of the invention in detail, it is to be understood that the invention is not necessarily limited in its application to the details of construction and the arrangement of the components and/or methods set forth in the following description and/or illustrated in the drawings. The invention is capable of other embodiments or of being practiced or carried out in various ways. Furthermore, a number of connection methods and layouts are described. While specific connection methods are described with respect to particular layouts, it should be understood that other connection methods (or in some cases prior art connection methods) can be used for some of the connections.

Referring now to the drawings, FIG. 1A is a flowchart illustrating a method 300 of producing a contact to the bulk of a silicon substrate, at a surface of the substrate previously coated with a passivation layer. FIGS. 2A-2G are schematic illustrations of the cross section of a substrate after the acts of method 300. For purpose of explanation of the method, reference will be made to a p-type silicon substrate to which the contacts are produced. It is noted that the same or a very similar method can be used for n-type silicon substrates.

Figure 2A:
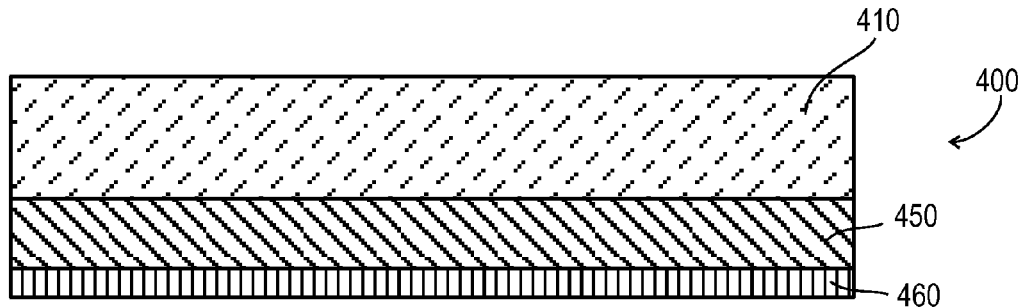

FIG. 2A illustrates a cell 400 formed on a p-type bulk material substrate 410. In FIGS. 2A-2k and 4A-4B the rear side is the lower side shown in the figure.

In some embodiments, the contacts to the substrate are produced at the rear surface of the substrate which is covered with a passivation layer 460. In some embodiments, the rear surface of the substrate also includes a doped layer or an n-type emitter 450 between the bulk of the substrate 410 and the passivation layer 460. In some embodiments, no emitter layer 450 is produced on the rear surface, however, the passivation layer causes an induced emitter to be formed on the rear surface of the substrate. For purpose of explanation, the following explanation will refer to a substrate having an emitter layer at its rear surface, however, the same method of production can be used for a substrate without such emitter.

Figure 2B:
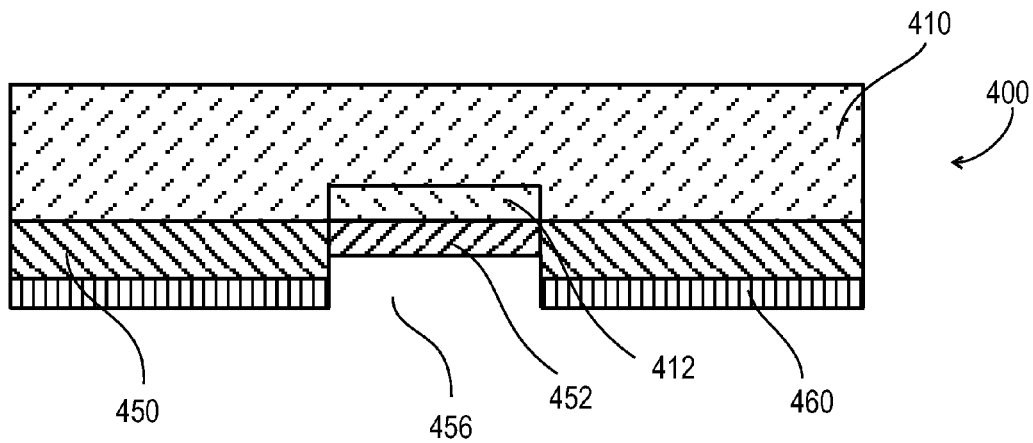

At 302 an opening is created at the rear surface of the p-type substrate, optionally by use of a laser. An example of such an opening is illustrated in FIG. 2B as opening 456. In some embodiments, the depth of the opening is such that the passivation layer and emitter are removed. In some embodiments, as shown in FIG. 2B, the depth of the opening is such that some or all of the emitter layer is left in the opening, the emitter layer remaining in the opening (indicated as 452 in FIG. 2B). In these embodiments, the connection to the bulk substrate is via emitter 452. Emitter 452 left in the opening is optionally damaged by the laser used for ablating opening 456. A part of substrate 410 might also be damaged by the laser, such as silicon layer 412 shown in FIG. 2B.

Optionally, after creating the opening, the substrate is cleaned to remove any residues originating from the laser ablation.

Figure 2C:
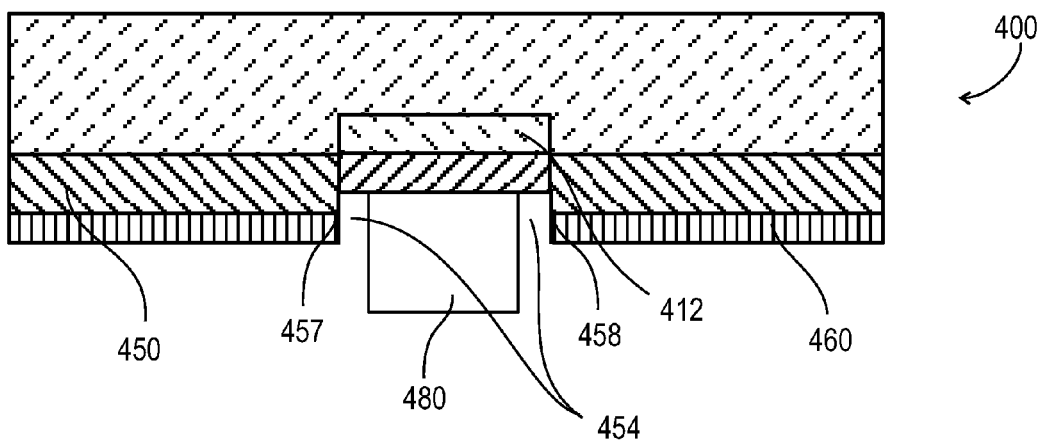

At 304, illustrated in FIG. 2C, an electrically conducting material or conductor 480 is deposited in the opening created at 302. Conductor 480 is preferably deposited such that conductor 480 does not contact emitter layer 460 at sidewalls 457 and 458 of opening 456. In some embodiments, conductor 480 is narrower than the opening and gaps 454 are left between conductor 480 and sidewalls 457 and 458 of the opening. In some embodiments, gaps 454 optionally have a width of between 2 µm-50 µm, optionally, between 5 µm-10 µm.

Substantial accurate alignment is required between opening 456 and conductor 480, especially if gaps are to be left. Optionally, the alignment is achieved by using a same laser (or different lasers with the same optical set-up) for ablating opening 456 and depositing conducting conductor 480. PCT Application no. PCT/IL2009/000608 filed on Jun. 18, 2009 teaches a method and system for creating openings and depositing material using a same laser set-up thereby achieving accurate alignment between the two.

Figure 5:
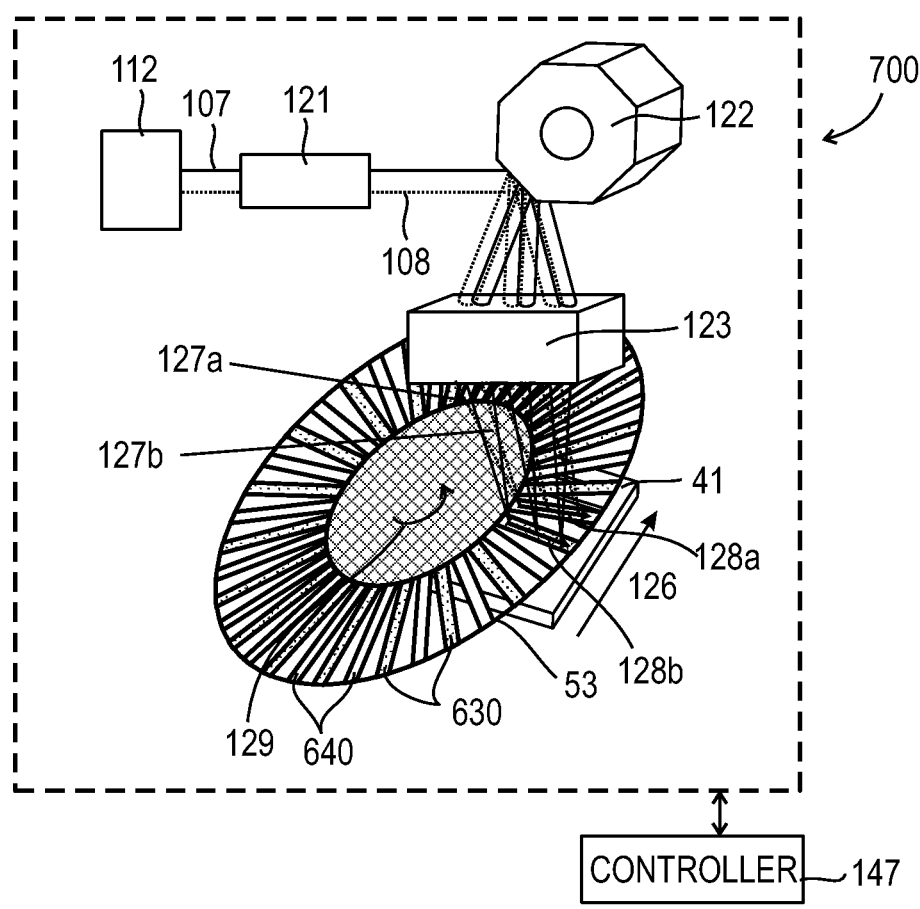
FIG. 5 is a schematic illustration of a contact deposition system as described in PCT/IL2009/000608.

FIG. 5 is a schematic illustration of a laser system 700 for ablating openings and laying down contacts to a silicon substrate 41 as described in PCT/IL2009/000608.

System 700 includes two laser sources 112 which are adapted to radiate two laser beams 107 and 108. Laser beams 107 and 108 pass through an acousto-optic deflector 121, impinge on a surface of a rotating polygon 122, pass through a lens 123 and eventually transform into two parallel laser lines 127a and 127b. Laser lines 127a and 127b are optionally radiated at substantially the same time and have the same direction.

A source substrate 53 which carries coating lines 630 for deposition as contacts on silicon substrate 41 is provided spaced slightly from the substrate on which the conductors are to be deposited. Source substrate 53 also includes optional slits 640 between the coated lines 630. Slits 640 are adapted to provide a space for a laser beam to pass through the source substrate and ablate openings in silicon substrate 41.

A controller 147 is provided for controlling the operation of scanning system 700. Controller 147 controls laser source 112 and polygon 122 such that laser line 127 scans a line 128a through slits 640 of source substrate 53 and irradiates silicon substrate 41, thereby ablating an opening in the silicon substrate. Controller 147 further controls laser source 112 and polygon 122 such that laser line 127b forms a scan line 128b which scans along and is absorbed by a conductive coating line 630 of the source substrate and causes its deposition onto the created opening in the receiving substrate.

The coating material is preferably provided as lines of material on the source substrate. Since there is no need to separate the lines from coating material on the sides of the lines, the laser power can be reduced such that either the entire line is transferred at one time or that it is transferred seriatim along its length without breaking.

Receiving substrate 41 is moved by controller 147 in a direction 126 which is substantially perpendicular to the scan lines and source substrate 53. Source substrate 53 is controlled by controller 147 to rotate around its axis in a direction 129 which causes the coating lines 630 to be substantially perpendicular to the scan lines when irradiated. The movement of silicon substrate 41 and source substrate 53 is preferably coordinated with the radiation of the laser beams by controller 147 so that each coated line 630 is deposited in an opening created in the passivation layer of silicon substrate 41. The laser beams are optionally irradiated at substantially the same time such that with each radiated laser line an opening is created in the receiving substrate and a previously created opening is filled with deposited material.

In some embodiments of the invention, system 700 is used for producing both contacts to the bulk of the substrate and contacts to an emitter layer of silicon substrate 41. Optionally, the two or more coating materials are provided on the same source substrate such that each coating line 630 is formed of different material and/or of different dimensions, such as thickness. Alternatively, two or more source substrates are provided having different coatings, and the coating material of the two or more source substrates are deposited on the same silicon substrate.

It is noted that more energy is required for ablation than for deposition of the coating material. Accordingly, laser beams 107 and 108 may be radiated at different powers. It is further noted that ablation for contacts to the bulk of the substrate and ablation for contacts to an emitter are at different energies and spot sizes due to different depth and optionally also sizes of the openings.

System 700 is advantageous since it provides faster production of receiving substrates as the two procedures of ablation and deposition are performed in series using the same set-up. In addition, as the same system is used for ablation and deposition of material, easier alignment (or no need for additional alignment) is obtained between the coating lines and the ablated lines.

The method and system described in the above referenced PCT application enables deposition of a single piece of homogenous material with a single laser operation. In addition, each piece of deposited material has optionally a height larger then its width. In some embodiments of the invention, the aspect ratio (height/width) of the coated lines is approximately between 0.3 to 3. Optionally, the height of the coated material is between 10 μm-300 μm, for example between 10 μm-150 μm. Optionally, the width of the coated line is between 10 μm-150 μm.

In some embodiments of the invention, conductor 480 is a single piece of homogenous material. In some embodiments of the invention, conductor 480 is finger shaped having substantially flat surfaces without protrusions thereon.

Conductor 480 is preferably a metallic material for conduction of electrons of the electrons-hole pairs converted from the absorbed photons.

Figure 2D:
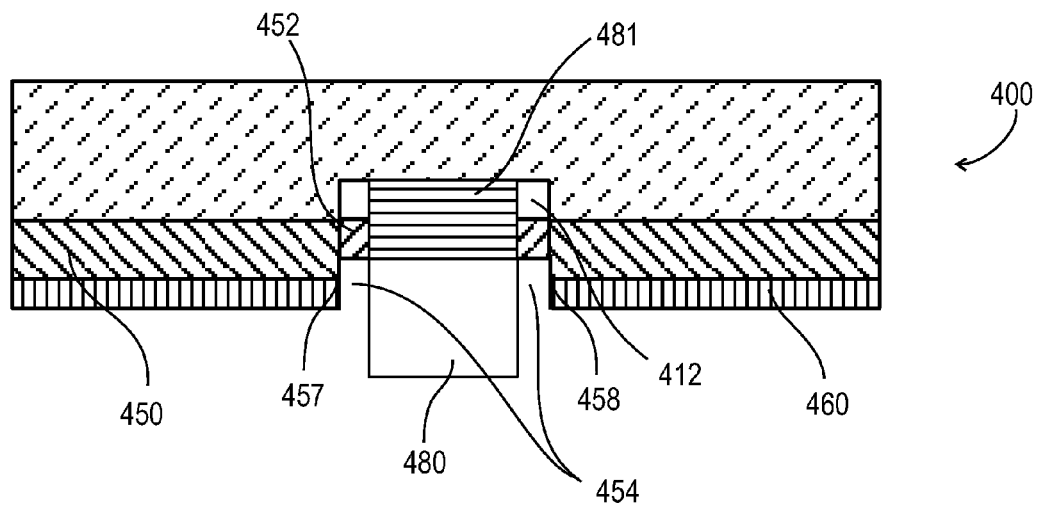

In some embodiments, the deposited contact is fired (at 305) for providing mechanical stability and good electrical connection between the contact and the bulk of the substrate, optionally through a remaining emitter layer in the opening. As shown in FIG. 2D, firing contact 480 causes alloying (or melting) of contact 480 with emitter layer 452 and silicon layer 412 such that a melted layer 481 is created.

In some embodiments, firing the conductor heavily dopes the surface of connection of the conductor to the silicon. Preferably, only the point of connection between the silicon and the contact is heavily doped. As shown in FIG. 2D, only melted layer 481 is heavily doped. Thus, there is optionally no connection between heavily doped silicon 481 and emitter layer 450. In some embodiments, the deposited contact includes some material which heavily dopes the point of connection. For example, conductor 480 may include Al which forms p+ contact 481 with the p-type substrate when heated (or fired) to about 800° C. Alternatively, when an n-type substrate is used, conductor 480 may be made of a mixture of Ag and Antimony which forms an n+ contact with the n-type substrate when heated (or fired) to about 900° C.

Figure 2E:
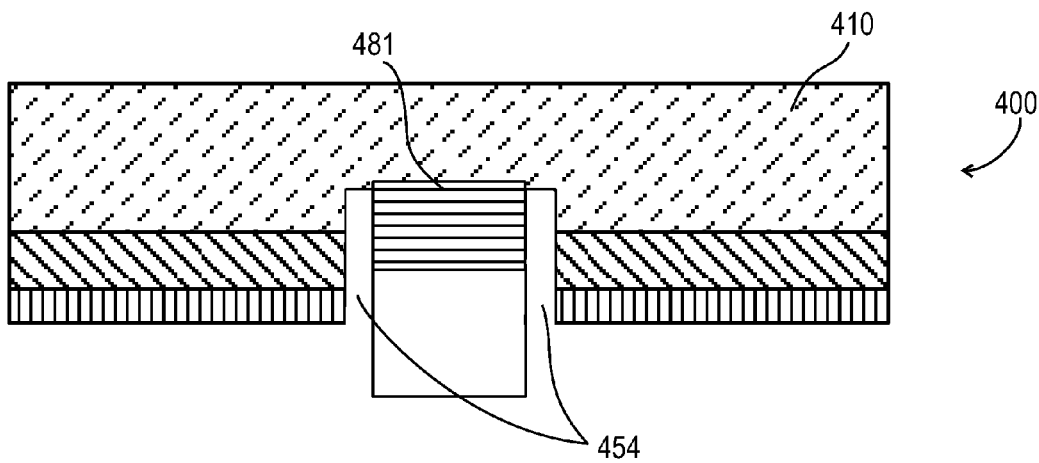

At 306 gaps 457 are etched to remove the laser damaged layers 412 and 452. As shown in FIG. 2E, gaps 454 are etched till reaching a non damaged surface of substrate 410. Etching of the gaps causes no emitter layer (or passivation layer with induced emitter) to be left in the gaps such that no shunting occurs between contacts 480 and emitter 450 and/or passivation layer 460. It also removes any heavily doped material that may cause a shunt between the conductor and the emitter layer.

In some embodiments, etching is formed by an etch material to which both conductor 480 and passivation 460 are substantially resistant. For example, when conductor 480 is Al-based or Ag-based, TMAH is used for etching. Ehen conductor 480 is Ag based KOH may also be used for etching. Alternatively, conductor 480 has a relatively large thickness (e.g. over 100 μm) and some of conductor 480 is also etched.

Figure 2F:
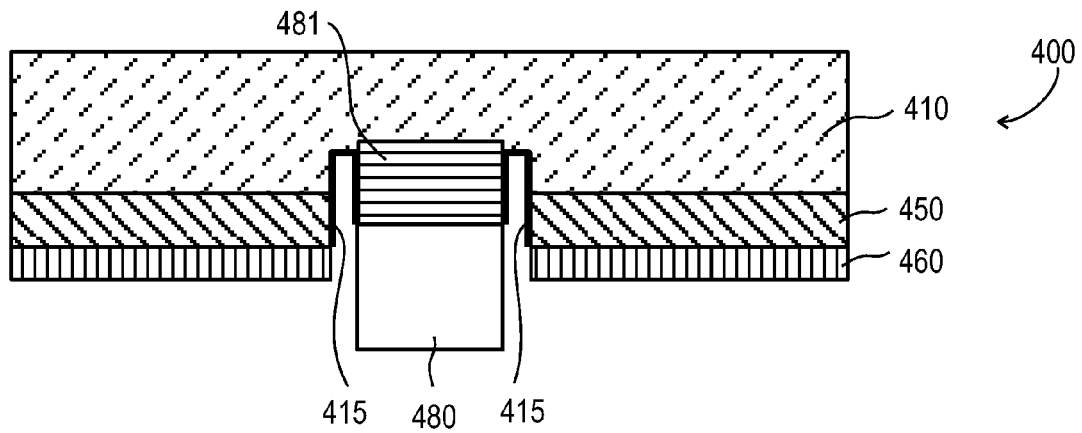
Figure 2G:
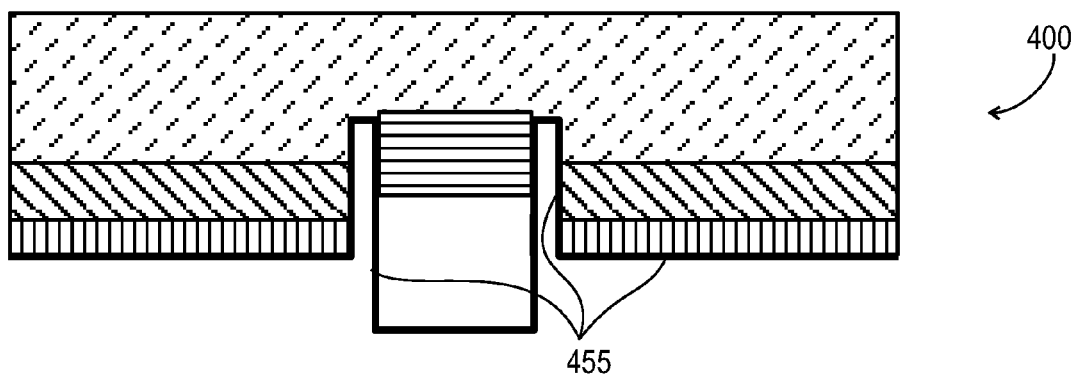

The etched gaps are then coated with a passivation layer at 308. Optionally, as shown in FIG. 2F, only the silicon and emitter in the gaps are passivated with a passivation layer 415. Optionally, passivation layer 415 is formed by oxidizing the exposed silicon. Alternatively, as shown in FIG. 2G, the entire rear surface of cell 400 is coated with a passivation layer 455. Optionally, passivation layer 455 is made of CVD.

In some embodiments of the invention, busbars are also deposited on the rear surface of the substrate to form a connection between conductors 480, optionally using laser deposition as described in PCT Application No. PCT/IL2009/000608.

Figure 6:
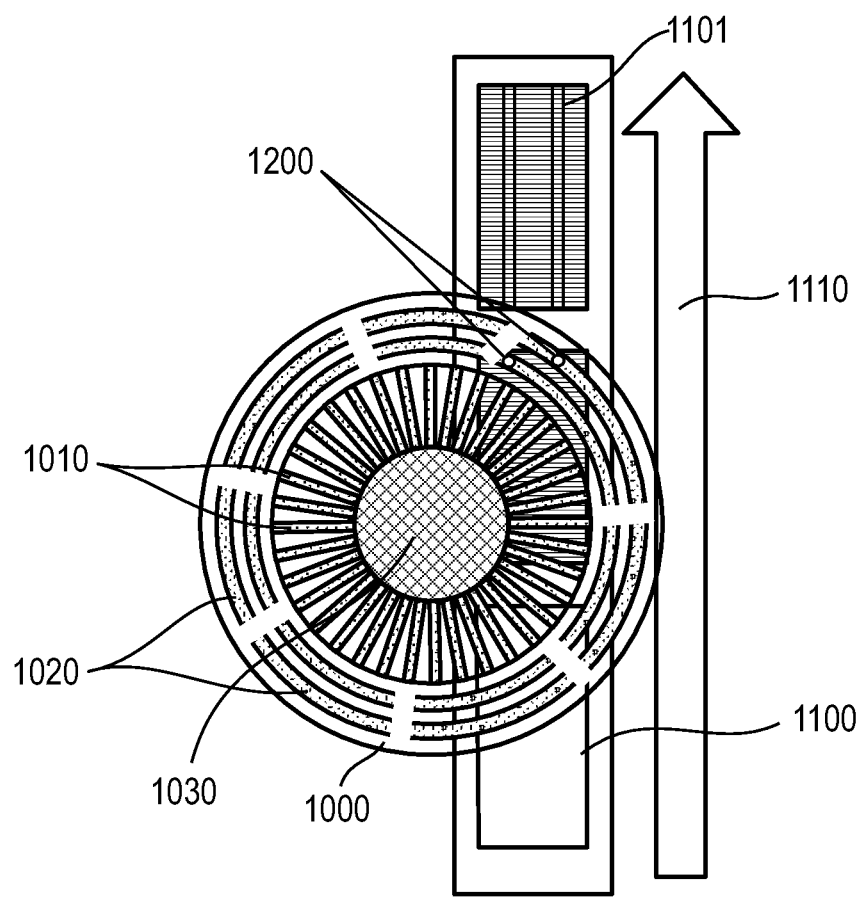
FIG. 6 is a schematic illustration of a source substrate and its relationship to a substrate to which contacts are to be attached for use with the system shown in FIG. 5.

FIG. 6 illustrates a source substrate 1000 used for producing both contacts and busbars as described in PCT/IL2009/000608. Substrate 1000 carries a first coating material 1010 in the form of radial lines aligned relative to the center of round substrate 1000 as described with respect to FIG. 5 above, first coating material 1010 may be made of different materials for different contacts. A second coating material 1020 is provided as two interspaced round lines. The sections of interspaced round lines 1020 are preferably of the same length.

Figure 7A:
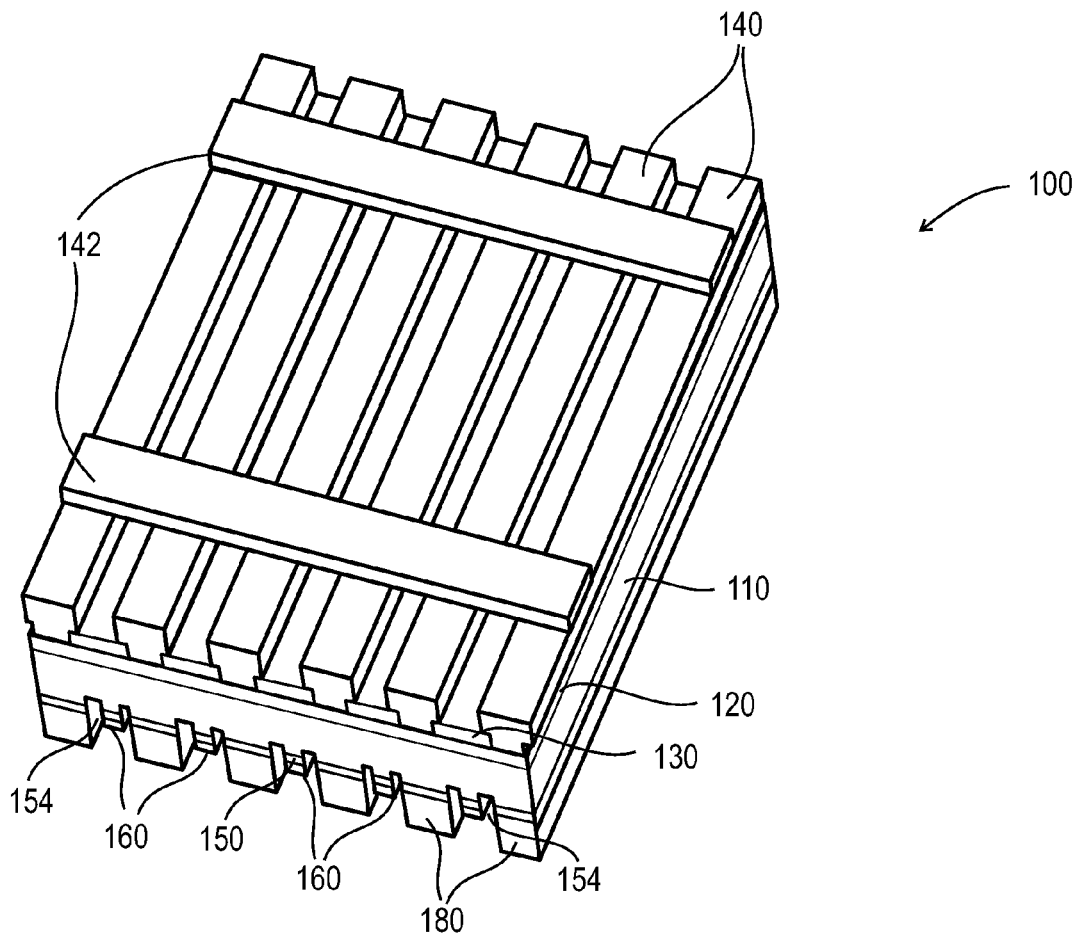
FIGS. 7A-7C are schematic illustrations of cross section and layouts of photovoltaic cells in accordance with some exemplary embodiment of the invention.

A produced source substrate 1101 is further shown in FIGS. 6 and 7A illustrating the contacts and busbars deposited thereon. The busbars are adapted to electrically connect to a respective group of fingers and to connect two or more photovoltaic cells together, for example by soldering or wire bonding.

For connecting between the contacts to n-type silicon, the busbars may be made of the same material as the contacts, for example silver. However, since the bus-bars are used for interconnecting cells and connecting to the outside world, the busbars are required to have high solderability, while the contacts to p-type silicon are preferably made of Al which has a relatively low solderability. Therefore, the busbars for connecting between contacts to p-type silicon may be made of a different material, for example Ag based material such as Ag—Al.

Source substrate 1000 is adapted to be used with a scanning system similar to the one shown in FIG. 5. Source substrate 1000 rotates around its axis 1030 and a plurality of silicon substrates 1100 are conveyed below the source substrate and laser line radiation in a direction 1110 (as shown and detailed in FIG. 5).

A scanning system used for source substrate 1000 further includes two additional laser sources which radiate two laser spots 1200. Laser spots 1200 irradiate at coating material 1200 in order to deposit coating material 1020 on silicon substrate 1100 after deposition of lines 1010 thereon. During coordinated rotation of source 1000 and movement of silicon substrate 1100, the laser spot will deposit a line in a direction parallel to 1110. Laser spots 1200 may be wider than coating pattern 1200 in order to compensate for inaccuracies in alignment of the laser spot. For example, coating material 1020 may have a width of 2 mm while the laser spot may have a diameter of 3 mm or more. Preferable, the spot size should be small enough to ensure that a same laser spot will not radiate both coating lines 1020. Alternatively, only one laser spot 1200 is provided which is large enough to radiate both lines 1020.

The spaces between the coating lines 1200 are coordinated with the spaces between receiving substrates 1100 such that a coating line 1200 will be deposited on one receiving substrate and will end substantially at the end of the receiving substrate. It is noted that some inaccuracies of alignment of coating material 1200 may be tolerated, for example, the coating material does not have to deposited at the edge of the receiving substrate but may be deposited away the edge, for example about 100 μm-200 μm from the edge (relative distance is exaggerated in the figures).

In some embodiments, the rear surface is coated with a reflector or thin reflecting layer for reflecting the photons that were not converted into electrons-hole pairs at the p-n junction.

Figure 1B:
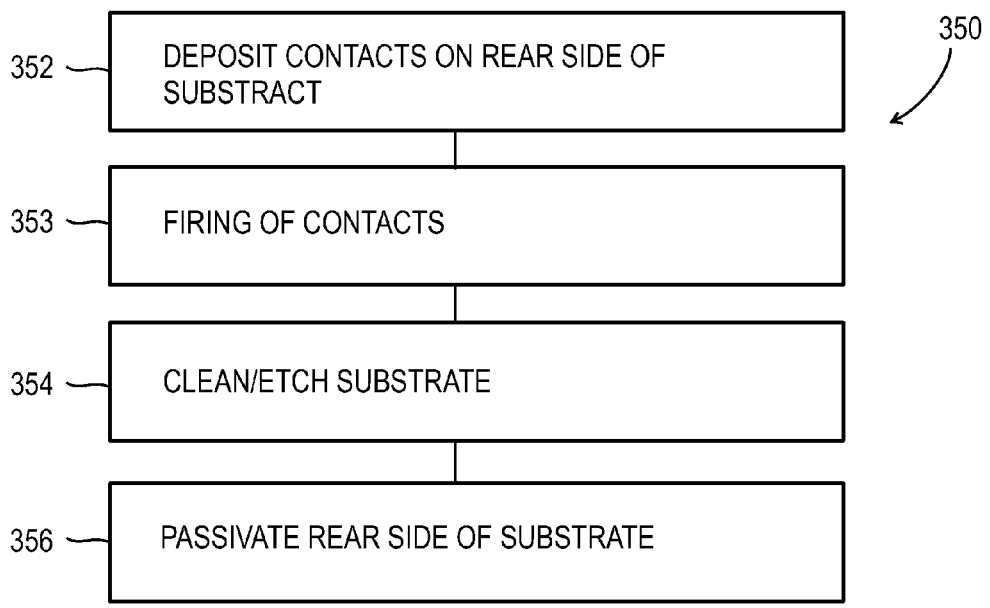
Figure 2H:
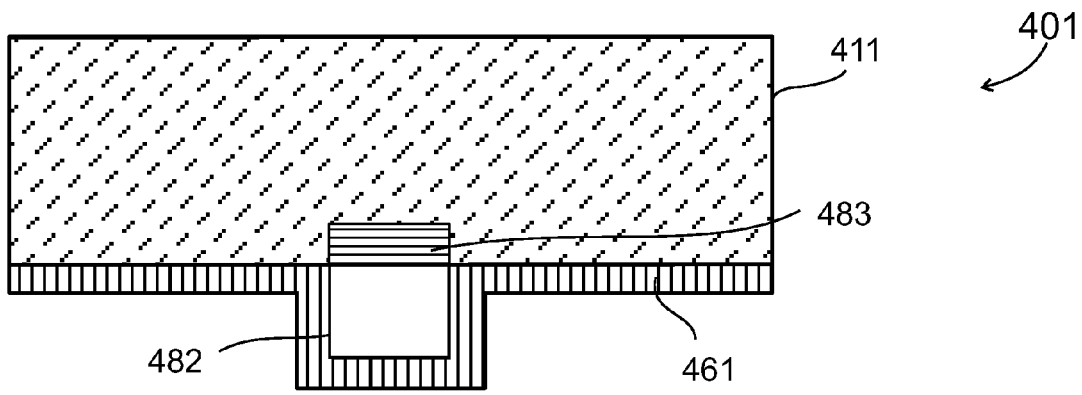

FIG. 1B is a flowchart of a method 350 of producing a contact to a bulk of a bare substrate. In some embodiments, neither a passivation layer nor a doped layer is produced on the bare surface of the substrate before depositing contacts thereon. FIG. 2H is a schematic illustration of a portion of a photovoltaic cell 401 having no doped layer and no passivation layer on which a contact 482 is produced on a substrate 411 in accordance with method 350.

At 352 contacts 482 are deposited on a bare substrate 411 as shown in FIG. 2H. Optionally the deposition is performed with the system illustrated in FIG. 5 and described in PCT/IL2009/000608. Alternatively the deposition is performed by screen printing or evaporation or any other deposition technique, all of which might causes residues to be left on the substrate around the coating material. The substrate is therefore optionally cleaned or etched after deposition of the contacts. In some embodiments, the contacts are fired at 353 in order to improve connection of the contacts to the silicon and/or to harden the contacts. Optionally, a heavily doped layer 483 is created at the point of connection between the contacts and substrate 411.

The substrate is cleaned or etched at 354 to remove residues from the firing and/or deposition. The inventors have found that the residues can be cleaned by etching (or cleaning) the substrate with a material to which the metal contacts are resistant. Examples of such materials are TMAH for Al based contacts (generally used for p-type substrates) and KOH for silver based contacts (generally used for n-type substrates). The present inventors have discovered that removal of a layer of the bulk material during such etching does not substantially degrade the operation of the cell.

At 356 the substrate, including contacts 482, is then passivated with a passivation layer 461. Optionally, the entire surface, including the contacts, is passivated. Alternatively, only the silicon surface is passivated, for example by oxidizing the exposed silicon.

Figure 2J:
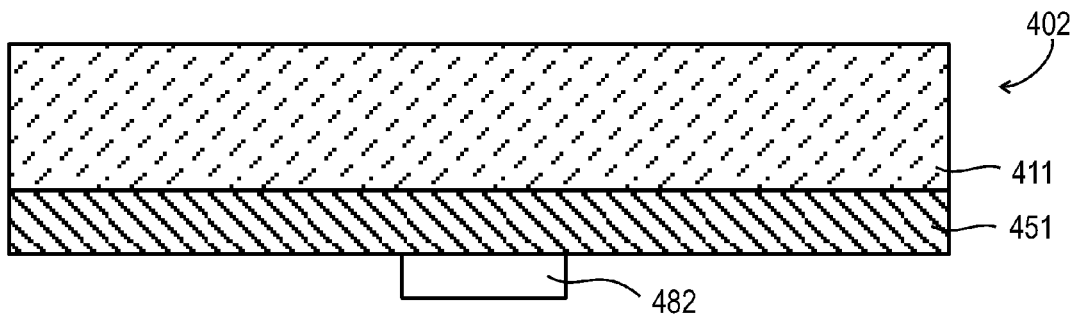
Figure 2J:
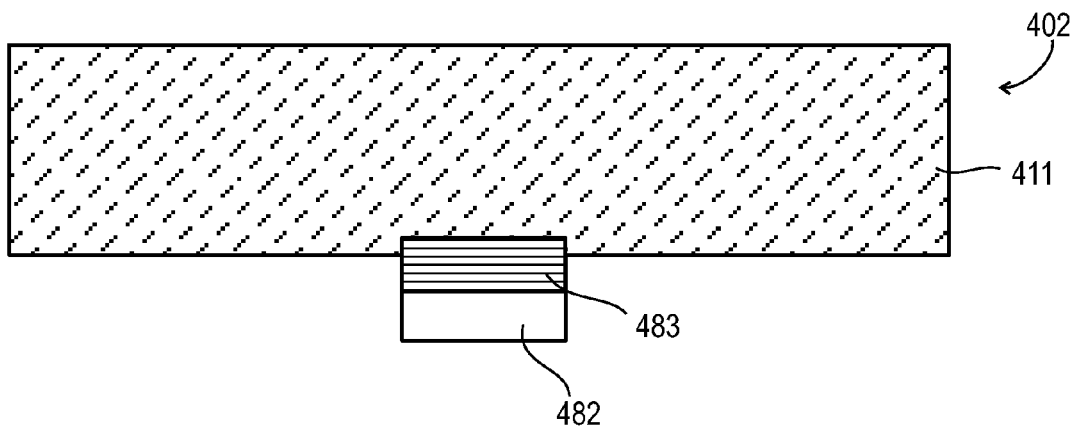
Figure 2K:
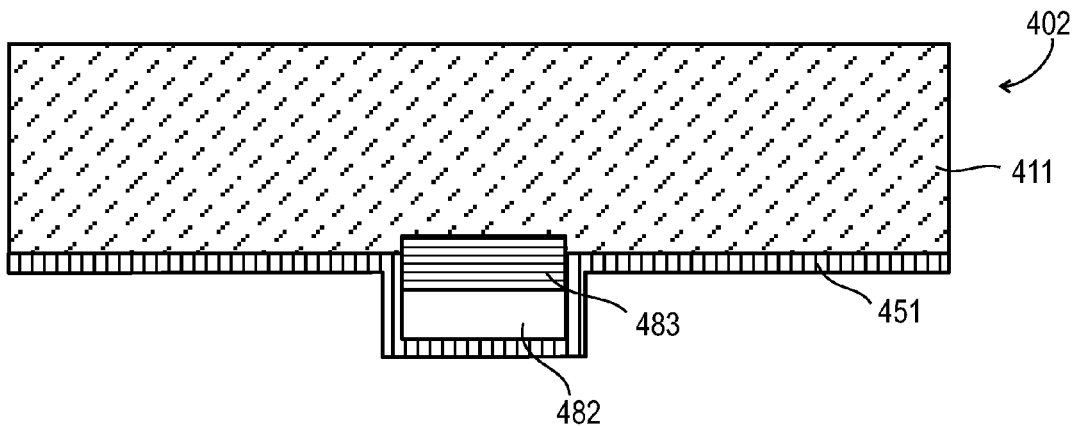

In some embodiments, the bare surface of the substrate has a doped layer but has no passivation layer before depositing contacts thereon. It is noted that providing an emitter layer causes guttering of the residues on the emitter layer, such that most of the residues are removed after etching emitter layer at 354. Firing the contacts at 353 causes the contacts to alloy (or melt) with the emitter and create a heavily doped contact with substrate 411. FIGS. 2I-2K are schematic illustrations of a portion of a photovoltaic cell 402 having a emitter 451 and no passivation layer, on which contacts are produced in accordance with the method 350. FIG. 2I illustrates contacts 482 deposited on a doped layer 451. FIG. 2J illustrates the substrate after firing at 353 and cleaning at 354. A heavily doped layer 483 is created between contacts 482 and substrate 411 and all of exposed doped layer 451 is removed by etching. FIG. 2K illustrates the substrate after passivation at 356.

In some embodiments of the invention, a reflecting layer is produced on the rear side of the substrate after producing of the contacts according to FIG. 1A or 1B. Optionally, the reflecting layer is a thin film (~1-5 nanometers) which may be deposited by vacuum. The deposition time of the reflective layer is generally very short and does not substantially affect the cost of production of the photovoltaic cell. In addition, it is noted that a reflective layer may improve the metal resistance and soldering properties of the rear side of the cell. Optionally, for example when the photovoltaic cell has contacts on both its front and rear side, the reflective layer is made of silver. Alternatively, for example when the rear side of the substrate includes contacts both to the bulk of the substrate and to an emitter, a dielectric film or film stack may be used as a reflective layer, which will avoid conduction between the different contacts.

Figure 3:
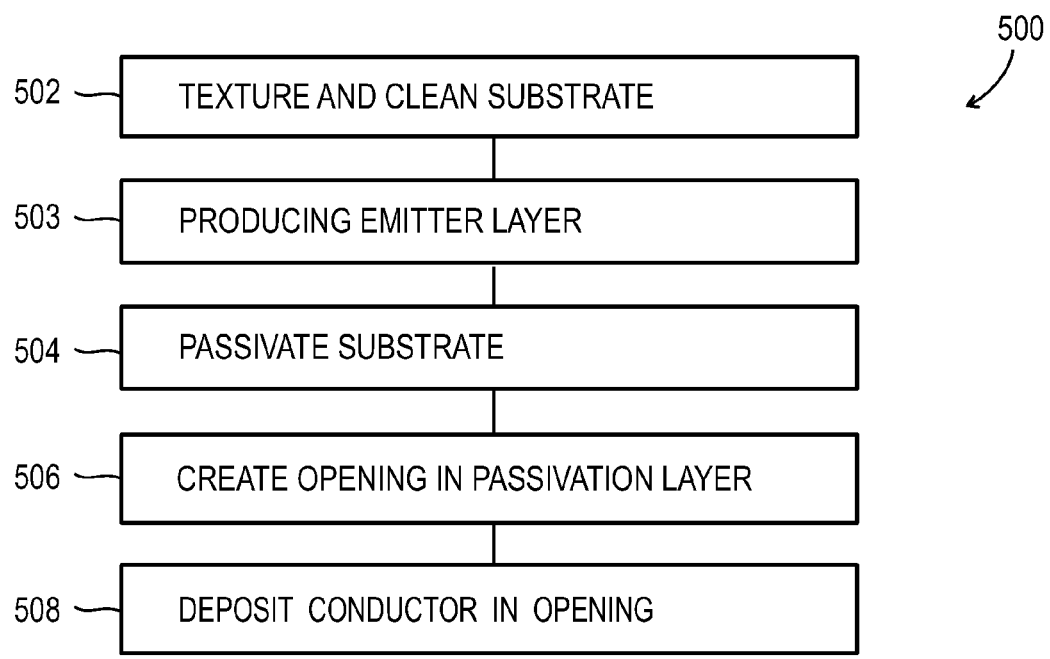
FIG. 3 is a flowchart of a method of manufacturing a contact to a doped layer or emitter of a substrate in accordance with some exemplary embodiments of the invention.
Figure 4A:
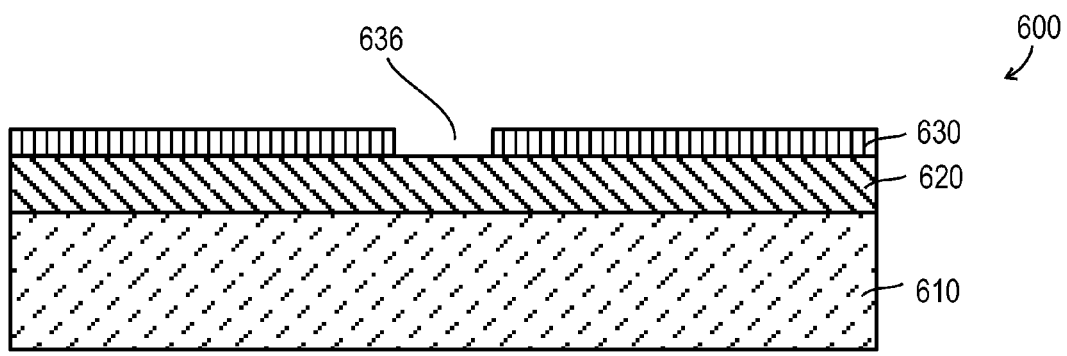
FIGS. 4A-4B are schematic illustrations of acts in the method of FIG. 3.
Figure 4B:
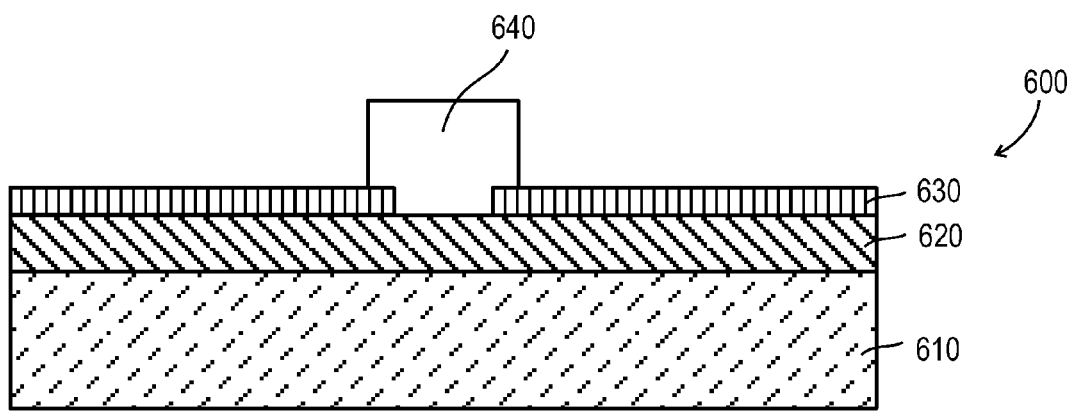

FIG. 3 is a flowchart illustrating a method 500 of producing a contact to an emitter produced on a silicon substrate coated with a passivation layer. FIGS. 4A and 4B are schematic illustrations of acts of method 500. For purpose of explanation of the method, reference will be made to a p-type silicon substrate produced with an n-type emitter to which contacts are produced. It is noted that the same method can be used for n-type silicon substrates produced with a p-type emitter. It is further noted that the following explanations will refer to contacts to an n-type emitter produced on the front surface of a substrate. However, the same method may apply to producing said contacts at the rear surface of a substrate.

Optionally, before producing the contacts the front surface of the substrate is textured at 502 to form a pyramidal or zigzag texture at its front surface. Texturing the substrate increases the anti-reflection properties of a solar cell and is therefore advantageous in some embodiments of the invention. At 503 a doped layer or emitter is produced on the front surface of the textured object. Optionally a passivation layer is produced on the doped layer at 504.

It is noted that in some embodiments of the invention, the rear surface of the subject can be textured and passivated before producing contacts thereon as described with respect to FIGS. 1 and 2 above.

At 506 an opening is created in the passivation layer, as shown in FIG. 4A. It is noted that FIG. 4A does not show a textured surface, however, the same method and illustrations can be applied to textured surfaces.

FIG. 4A illustrates a photovoltaic cell including a p-type silicon substrate 610, an n-type emitter 620 produced on the front surface of the substrate and a passivation layer 630 produced on emitter 620. FIG. 4A further illustrates an opening 636 created in passivation layer 630. The depth of opening 636 is preferably such that it does not damage emitter 620.

Optionally, opening 636 is created by laser ablation at a power level that does not ablate emitter 620.

At 508, a conducting material 640 is deposited in opening 636, as illustrated in FIG. 4B. Preferably, conducting material 640 is wider than the opening such that the edges of the material overlay passivation layer 630. In some embodiments of the invention, material 640 is deposited by use of a laser, optionally the same laser (or different lasers with the same optical set up) as used for creating opening 636. Optionally, the opening is created and the material is deposited according to the methods and systems described in PCT Application no. PCT/IL2009/000608 and illustrated in FIGS. 5 and 6 herein.

Optionally, conducting material 640 is heated for hardening thereof and improving connection to the silicon. Optionally, heating the conducting material also creates a heavily doped layer at the point of connection of the conducting material to the emitter. Preferably, heating the conducting layer does not cause melting of the conducting layer with the emitter, which can cause a connection to the bulk of the substrate as described with reference to FIGS. 1A and 1B above. Optionally, for example when emitter 620 is an n-type emitter, conducting material 640 is Ag-based which does not alloy the entire emitter layer 620 when heated.

Reference is now made to the layout of photovoltaic cells to which contacts are produced, optionally by the methods described in FIGS. 1-6.

FIG. 7A illustrates a layout of a photovoltaic cell 100 having contacts both at the front and rear surfaces of the cell, in accordance with an exemplary embodiment of the invention. The cell includes a substrate 110 made of preferably mono- or alternatively multi-crystalline silicon. In some embodiments, the thickness of the substrate is optionally between 100 μm-200 μm. Alternatively, the thickness is about 300 μm. Alternatively, the thickness of substrate 110 is between 10 μm-100 μm. For purpose of explanation, silicon substrate 110 is referred to as a p-type substrate. However, the same explanations with necessary changes apply to production of an n-type substrate.

An n-type emitter layer 120 is laid or doped on the front surface of the substrate and emitter layer 120 is further coated with a passivation layer 130. The front surface of cell 100 further includes contacts 140 to the emitter layer 120 through passivation 110. Optionally, contacts 140 are silver based contacts which form a good connection with n-type emitter layers 120. In some embodiments, contacts 140 have a width and/or thickness of between 10 μm-100 μm, optionally about 50 μm. Optionally, the aspect ratio of the thickness to width of the contacts is between 0.3 to 3. Optionally, a space of about 1 mm-3 mm is provided between contacts 140. Optionally, each surface of cell 100 includes about 40 fingers.

Contacts 140 are optionally produced using method 500 of FIG. 3.

Cell 100 further includes a passivation layer 160 at its rear surface. The rear surface of cell 100 further includes contacts 180 to bulk 110 through the passivation layer.

In some embodiments, cell 100 also includes a floating emitter layer 150 between bulk 110 and passivation layer 160. The presence of the emitter layer 150 provides better passivation properties than substrate 110. In these embodiments, contacts 180 are formed through passivation 160 and through (floating) emitter layer 150. Optionally, no emitter layer 150 is produced on the rear surface, but passivation layer 160 causes an induced emitter at the rear surface. In this case too, no interconnection should be present between the contacts to the bulk and passivation layer 160. Preferably, contacts 180 do not touch floating emitter layer 150 or passivation layer 160 and gaps 154 are provided between contacts 180 and emitter 150 and/or passivation layer 160. Contacts 180 are optionally produced using the method described in FIG. 1A.

In some embodiments of the invention, contacts 180 have a width of less than 500 μm. Optionally, the width and/or thickness of contacts 180 are between 50 μm-400 μm, 50 μm-100 μm or 10 μm-100 μm. In some embodiments of the invention, the aspect ratio of the width to thickness of contacts 180 is less than 0.1, 0.2 or 1.

In some embodiments of the invention, contacts 180 are made of Al which provides a p+ type contact to silicon substrate 110 when heated to about 800° C. In some embodiments of the invention, substrate 110 is an n-type substrate and contacts 180 include Ag-Antimony for providing an n+ type contact to n-type substrate 110 when heated to about 900° C.

In some embodiments of the invention, contacts 180 are finger shaped and have substantially flat surfaces without protrusions thereon. Contacts 140 are optionally also finger shaped and may have a protrusion on the surface facing the substrate. Contacts 140 and 180 are optionally formed of one piece of homogenous material.

In some embodiments, cell 100 further includes busbars on the front and rear surfaces of the cell for connecting between contacts 140 and 180 respectively, such as for example busbars 142 shown in FIG. 7A.

Figure 7B:
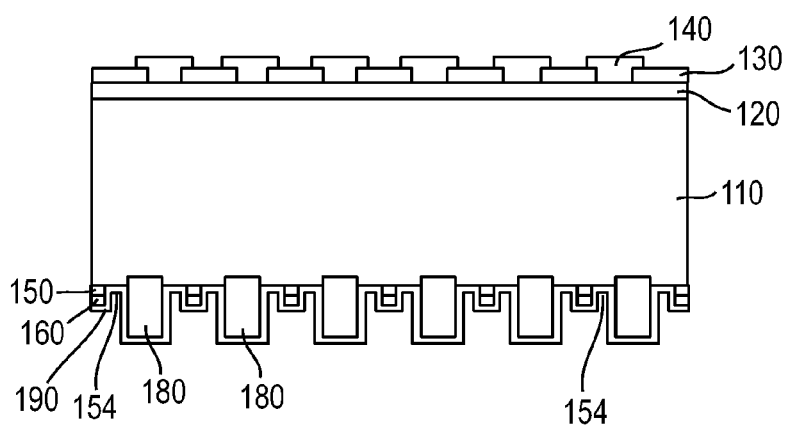

FIG. 7B is a cross section of the cell illustrated in FIG. 7A. As shown in FIG. 7B, gaps 154 are preferably coated with a passivation layer 190. Optionally, passivation layer 190 coats the entire rear surface of the cell, as shown in FIG. 7B. Alternatively, passivation layer 190 is present only on the silicon material and emitter in gaps 154.

Figure 7C:
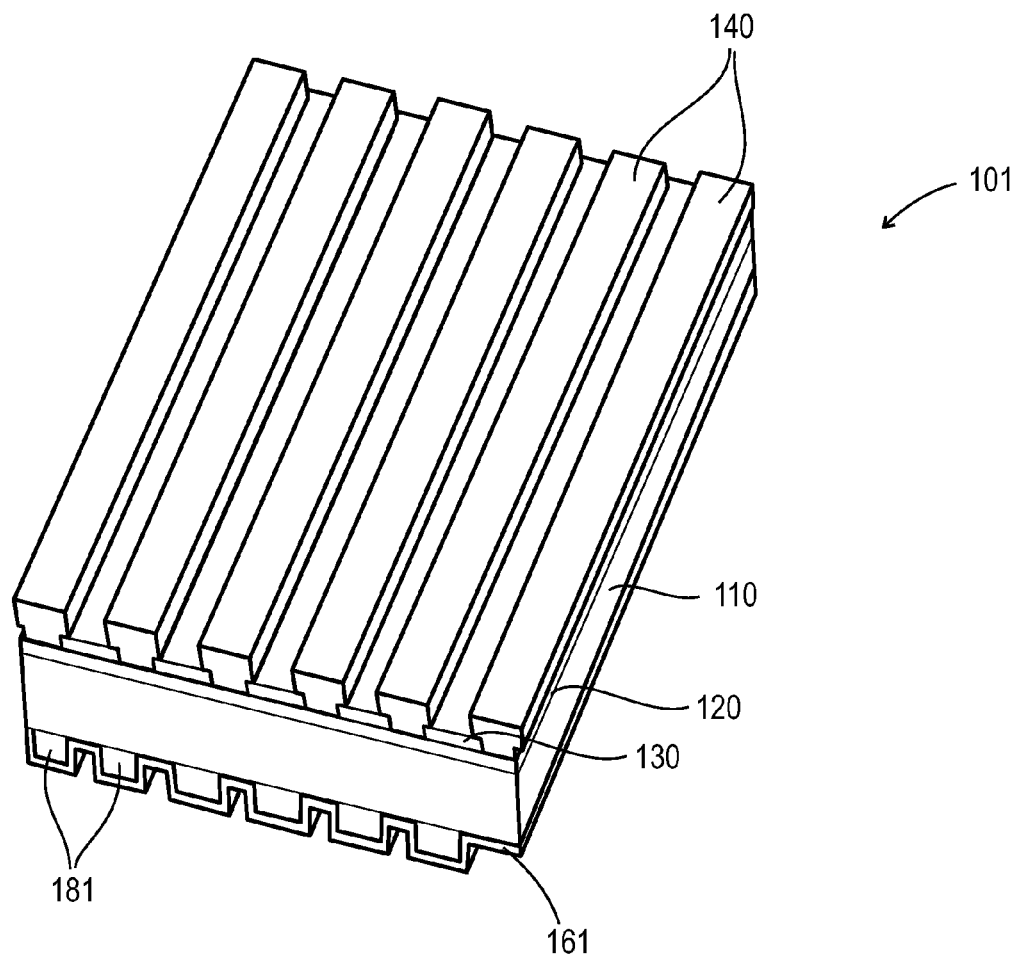

FIG. 7C is a schematic illustration of a layout of a photovoltaic cell 101 to which contacts are produced both at the front and rear surface of the cell, in accordance with another exemplary embodiment of the invention. Cell 101 includes a substrate 110 and contacts 142 to an emitter layer 120 at its front surface. Contacts 142 are similar to contacts 140 described with respect to FIG. 7A above.

Cell 101 does not include an emitter layer at its rear surface. Cell 101 includes contacts 181 at its rear surface which are connected to the bulk of substrate 110. Rear surface of cell 101 and contacts 140 are coated with a passivation layer 161.

Bus-bars (not shown) are generally provided for connecting between the fingers and connecting to the outside.

It is noted that FIGS. 7A-7C are only exemplary embodiments and other exemplary embodiments include combinations of contacts produced with the embodiments described with respect to FIGS. 1-6 above. For example, contacts 181 shown in FIG. 7B may be produced on a doped layer.

Figure 8A:
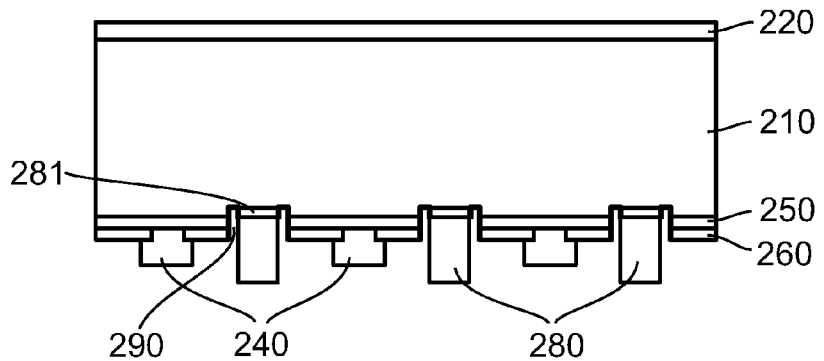
FIGS. 8A and 8B are schematic illustrations of cross section and layout of a rear surface of a photovoltaic cell, respectively, in accordance with some other exemplary embodiments of the invention.

FIG. 8A illustrates a cross-section of a photovoltaic cell 200 in which the rear surface of the cell includes both contacts to the bulk of the substrate and contacts to an emitter, in accordance with other embodiments of the invention. Cell 200 is formed of a silicon substrate 210, similar to substrate 110 described above. Substrate 210 is coated at the front surface with a passivation layer 220 and at the rear surface with a passivation layer 260. Cell 200 further includes an emitter layer 250 between substrate 210 and passivation layer 260. Optionally, cell 200 does not include an emitter layer at its front surface and no contacts are produced at the front surface.

Cell 200 includes contacts 240 to emitter layer 250 and contacts 280 to the bulk of substrate 210 at the rear surface of the substrate. In some embodiments of the invention, contacts 240 are similar to contacts 140 described with respect to FIG. 7A and the production of which is described in FIG. 3A above. Alternatively, contacts 240 are similar to contacts 142 described with respect to FIG. 7B above and the production of which is described in FIG. 3B above. In some embodiments, contacts 280 are similar to contacts 180 described with respect to FIG. 7A and the production of which is described in FIG. 1A above. Alternatively, contacts 280 are similar to contacts 181 described with respect to FIG. 7B above and the production of which is described in FIG. 1B.

In some embodiments, the silicon at the point of connection to the contacts is heavily doped. For example, when substrate 210 is a p-type substrate, a p+ type layer is created between contacts 280 and substrate 210. Optionally, contacts 280 include Al and the p+ layer is created by heating the Al to about 800° C. In these embodiments, the p+ layer is created only at the points of connection between contacts 280 and substrate 210 such that there is no connection between p+ layer and emitter 250.

In some embodiments of the invention, cell 200 further includes an additional passivation layer 290 at its rear surface. Optionally, the rear surface is further coated with a reflector (not shown) for reflecting the light that was not absorbed. If the reflector is made of an insulating material, the reflector can be laid on the entire rear surface. However, if the reflector is made of a conducting material, gaps should be formed in the reflector layer such that the layer will not form a connection between contacts 240 and contacts 280. Optionally, for example when the photovoltaic cell has contacts on both its front and rear side, the reflective layer is made of silver. Alternatively, for example when the rear side of the substrate includes contacts both to the bulk of the substrate and to an emitter, a dielectric film or film stack may be used as a reflective layer, which will avoid conduction between the different contacts. Optionally, the reflector is laid on top of passivation layer 290. Optionally, the distance between contacts 280 is between about 1 mm-3 mm.

Figure 8B:
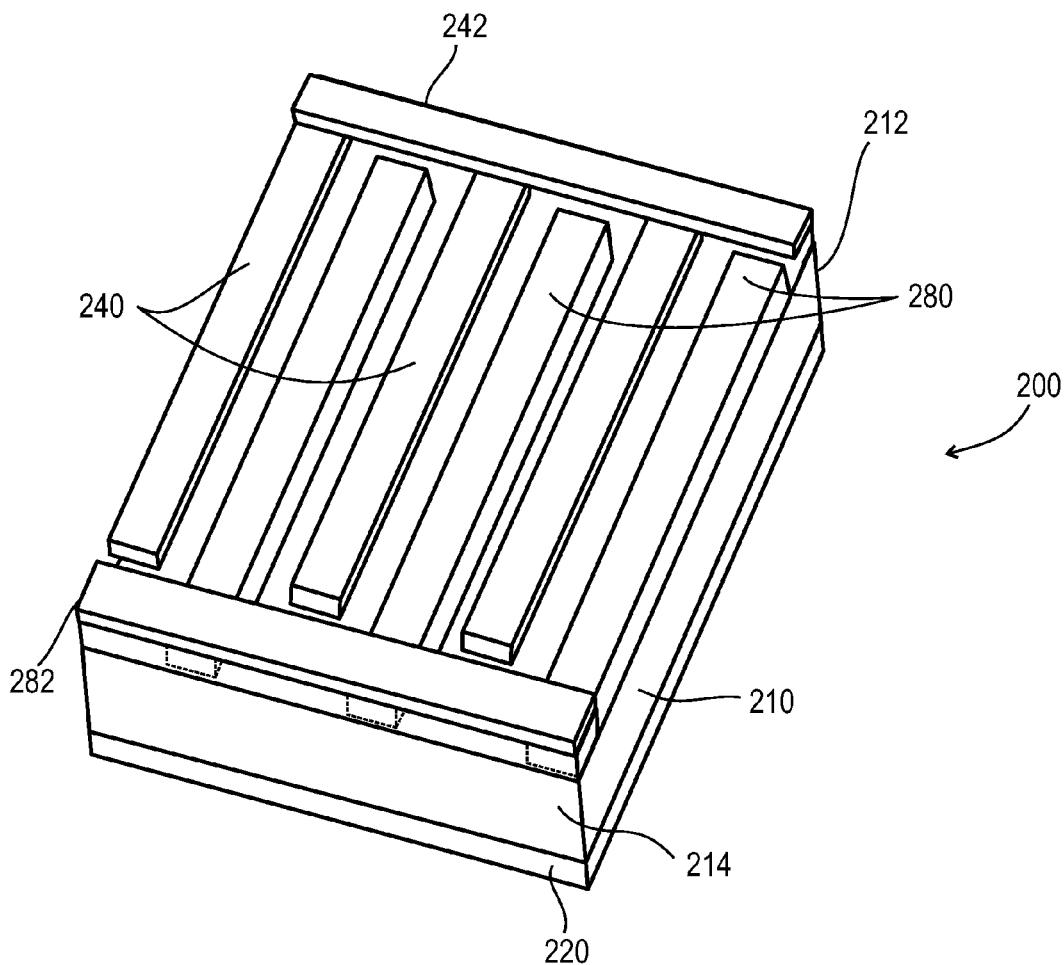

FIG. 8B is a schematic illustration of the rear surface of cell 200. As shown in FIG. 8B, cell 200 further includes a busbar 242 for connecting between contacts 240 and a busbar 282 for connecting between contacts 280. There should preferably not be any connection between contacts 240 and 280. Accordingly, contacts 240 are deposited close to a right side 212 of substrate 210 and end before a left side 214 of substrate 210. Similarly, contacts 214 are deposited close a left side 214 and end before right side 212. Optionally, a space of between 10 μm-1 mm is left between the busbars and the contacts which do not connect to it. Thus, busbar 242 positioned at right side 212 forms a connection between contacts 240 without forming any connection to contacts 280. Similarly, busbar 282 positioned at left side 214 forms a connection between contacts 280 without contacting contacts 240.

Busbars 242 and 282 are optionally made of the same material as the contacts they are connected to. However, since Al is not suitable for soldering, busbars to Al contacts may be made of Al—Ag metal.

As used herein the term "about" refers to ±10%.

The terms "comprises", "comprising", "includes", "including", "having" and their conjugates mean "including but not limited to". This term encompasses the terms "consisting of" and "consisting essentially of".

The phrase "consisting essentially of" means that the composition or method may include additional ingredients and/or steps, but only if the additional ingredients and/or steps do not materially alter the basic and novel characteristics of the claimed composition or method.

As used herein, the singular form "a", an and the include plural references unless the context clearly dictates otherwise. For example, the term "a compound" or "at least one compound" may include a plurality of compounds, including mixtures thereof.

The word "exemplary" is used herein to mean "serving as an example, instance or illustration". Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments". Any particular embodiment of the invention may include a plurality of "optional" features unless such features conflict.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. A photovoltaic cell, the cell comprising:
   a silicon substrate of bulk silicon material having front and rear surfaces;
   an emitter layer on the rear surface of said substrate;
   laser ablated elongate substantially rectangular channels through the emitter layer;
   elongate contacts to the bulk of the silicon substrate within at least some of the elongate channels, wherein the contacts are narrower than the channels; and
   air-gaps in the emitter between at least some of the elongate contacts and the emitter layer on the sides of the contacts, wherein said air-gaps have two substantially parallel walls, wherein a distance between said parallel walls is between 2-10 μm.

2. A cell according to claim 1, wherein the emitter layer comprises a doped layer with opposite polarity to the silicon substrate.

3. A cell according to claim 1, wherein the emitter comprises an induced emitter created by a passivation layer provided on the rear surface of the substrate, and wherein the laser ablated elongate channels comprise channels through the passivation layer.

4. A cell according to claim 1, wherein the cell further comprises a passivation layer produced on the emitter layer at the rear surface of the substrate, and wherein the laser ablated elongate channels comprise channels through the passivation and emitter layer.

5. A cell according to claim 1, wherein the elongate contacts have a width of between 10 µm-100 µm.

6. A cell according to claim 1, wherein the elongate contacts have a thickness of between 10 µm-100 µm.

7. A cell according to claim 1, wherein the ratio of the height to width of the elongate contacts is between about 0.3 and 3.

8. A cell according to claim 1, wherein the contacts are formed of a conducting material that is substantially homogeneous over its thickness.

9. A cell according to claim 1, wherein a heavily doped layer is created at least between the contacts to the bulk material and the substrate.

10. A cell according to claim 9, wherein the gaps separate between the heavily doped layer and the emitter layer.

11. A cell according to claim 1, wherein the cell further comprises additional elongate channels through the passivation layer on the rear surface of the substrate and additional elongate contacts to said emitter layer within said channels through the passivation layer.

12. A cell according to claim 1, wherein the cell further comprises an emitter layer at the front surface of the substrate and a passivation layer on the emitter layer at the front surface of the substrate, and the cell further includes contacts to the emitter layer at the front surface of the substrate.

13. A cell according to claim 11, wherein the elongate contacts to the emitter layer have a width of between 10 µm-100 µm.

14. A cell according to claim 11, wherein the elongate contacts to the emitter layer have a thickness of between 10 µm-100 µm.

15. A cell according to claim 11, wherein the ratio of the height to width of the elongate contacts to the emitter layer is between about 0.1 and 1.

16. A cell according to claim 1, wherein said cell includes an additional passivation layer at its rear surface.

17. A cell according to claim 16 wherein said additional passivation layer is present only in said gaps.

18. A cell according to claim 1, further comprising:
a reflective layer at the rear surface of the cell.

19. A cell according to claim 18, wherein the reflective layer is a thin metal layer.

20. A cell according to claim 18, wherein the reflective layer is a dielectric layer.

21. A method of producing a contact to a silicon substrate through an emitter, the method comprising:
creating a rectangular channel opening in the emitter layer at a surface of said substrate by laser ablation; and
depositing conducting material in said opening, the conducting material being smaller in size than the opening such that air-gaps are left between the conducting material and the sidewalls of the opening, wherein said air-gaps have two substantially parallel walls and wherein a distance between said parallel walls is between 2-10 µm.

22. A method according to claim 21, wherein producing a contact to a silicon substrate through an emitter layer comprises producing a contact to a silicon substrate having a passivation layer over the emitter layer and wherein creating an opening comprises creating an opening through the passivation layer and through at least part of the emitter layer.

23. A method according to claim 21, wherein the method further comprises:
heavily doping at least the point of connection of the deposited conducting material with the substrate.

24. A method according to claim 22, wherein the method further comprises:
creating an additional opening in the passivation layer at said surface; and
depositing conducting material in the additonal opening thereby creating a contact to the emitter layer.

25. A method according to claim 24, wherein the method further comprises:
producing a first busbar for connecting between the contacts to the bulk of the substrate; and
producing a second busbar for connecting between the contacts to the emitter layer.

26. A method according to claim 25, wherein producing a first and second busbar comprises producing first and second busbars such that there is no connection between the first and second busbars.

27. A method according to claim 21, further comprising:
etching the gaps in the opening; and
passivating at least the etched gaps.

28. A method according to claim 27, wherein etching the gaps comprises etching with TMAH.

29. A method according to claim 27, wherein etching the gaps comprises etching with KOH.

30. A method according to claim 27, wherein the method further comprises:
passivating the etched gaps.

31. A method according to claim 30, wherein passivating the etched gaps comprises passivating an entire surface of the substrate.

32. A method according to claim 30, wherein passivating the etched gaps comprises passivating substantially only the silicon in the etched gaps.

33. A method according to claim 21, wherein the method further comprises:
creating an opening in a passivation layer at an opposite surface to said surface; and
depositing conducting material in the opening at the opposite surface, thereby creating a contact to an emitter layer at said opposite surface.

34. A method according to claim 33, wherein depositing conducting material in the opening thereby creating a contact to the emitter layer comprises depositing conducting material having a width of between 10 µm-100 µm.

35. A method according to claim 33, wherein depositing conducting material in the opening thereby creating a contact to the emitter layer comprises depositing conducting material having a thickness of between 10 µm-100 µm.

36. A method according to claim 33, wherein depositing conducting material in the opening thereby creating a contact to the emitter layer comprises depositing conducting material having a ratio of the height to width between about 0.1 and 1.

37. A method according to claim 21, wherein depositing conducting material in said opening comprises depositing by laser.

38. A method of producing a contact to a silicon substrate through an emitter, the method comprising:
creating an opening in the emitter layer at a surface of said substrate by laser ablation; and
depositing, by laser, conducting material in said opening, the conducting material being smaller in size than the opening such that air-gaps are left between the conducting material and the sidewalls of the opening, wherein said air-gaps have a width of between 2-10 µm.

* * * * *